(12) United States Patent
Kim et al.

(10) Patent No.: US 11,849,615 B2
(45) Date of Patent: Dec. 19, 2023

(54) DISPLAY DEVICE WITH PROTECTION AGAINST ELECTROSTATIC DISCHARGE

(71) Applicant: SAMSUNG DISPLAY CO., LTD., Yongin-si (KR)

(72) Inventors: Yang Wan Kim, Yongin-si (KR); Byung Sun Kim, Yongin-si (KR); Su Jin Lee, Yongin-si (KR); Hyung Jun Park, Yongin-si (KR); Jae Yong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/706,287

(22) Filed: Mar. 28, 2022

(65) Prior Publication Data

US 2022/0216292 A1 Jul. 7, 2022

Related U.S. Application Data

(63) Continuation of application No. 16/723,970, filed on Dec. 20, 2019, now Pat. No. 11,289,566, which is a (Continued)

(30) Foreign Application Priority Data

Nov. 29, 2016 (KR) .................. 10-2016-0160814

(51) Int. Cl.
*H01L 21/02* (2006.01)
*H10K 59/131* (2023.01)
(Continued)

(52) U.S. Cl.
CPC ....... *H10K 59/131* (2023.02); *H10K 59/1213* (2023.02); *H10K 59/1216* (2023.02);
(Continued)

(58) Field of Classification Search
CPC ............. H10K 59/131; H10K 59/1213; H10K 59/1216; H10K 59/88; H10K 2102/341;
(Continued)

(56) References Cited

U.S. PATENT DOCUMENTS 6,774,414 B2   8/2004 Chang
6,795,049 B2   9/2004 Toyoshima et al.
(Continued)

FOREIGN PATENT DOCUMENTS

CN   1503921 A   6/2004
CN   1628263 A   6/2005
(Continued)

OTHER PUBLICATIONS

US 9,196,668 B2, 11/2015, Kim et al. (withdrawn)
(Continued)

*Primary Examiner* — Tan N Tran
(74) *Attorney, Agent, or Firm* — Lewis Roca Rothgerber Christie LLP

(57) ABSTRACT

A display device including a substrate including a first display region having a first width, a second display region having a second width smaller than the first width, a peripheral region at a periphery of the first and second display regions, and a dummy region in the peripheral region, a first pixel in the first display region, a second pixel in the second display region, a first control line connected to the first pixel and extending in the first display region, a second control line connected to the second pixel and extending in the second display region, and a dummy line connected to the second control line in the dummy region, wherein the second control line is at a first conductive layer on a first insulating layer, the dummy line is at a second conductive layer on a second insulating layer on the first conductive layer.

20 Claims, 12 Drawing Sheets

Related U.S. Application Data continuation of application No. 16/152,316, filed on Oct. 4, 2018, now Pat. No. 10,516,016, which is a continuation of application No. 15/721,353, filed on Sep. 29, 2017, now Pat. No. 10,115,780.

(51) Int. Cl.
  *H10K 59/88* (2023.01)
  *H10K 59/121* (2023.01)
  *H10K 102/00* (2023.01)
  *G09G 3/3233* (2016.01)
  *G09G 3/3266* (2016.01)
  *G09G 3/3275* (2016.01)

(52) U.S. Cl.
  CPC ........... *H10K 59/88* (2023.02); *G09G 3/3233* (2013.01); *G09G 3/3266* (2013.01); *G09G 3/3275* (2013.01); *G09G 2300/0413* (2013.01); *G09G 2300/0426* (2013.01); *G09G 2320/0233* (2013.01); *G09G 2330/02* (2013.01); *G09G 2330/04* (2013.01); *H10K 2102/341* (2023.02)

(58) Field of Classification Search
  CPC .. H10K 59/124; G09G 3/3233; G09G 3/3266; G09G 3/3275; G09G 2300/0413; G09G 2300/0426; G09G 2320/0233; G09G 2330/02; G09G 2330/04; H01L 27/124; H01L 2251/5392; H01L 27/3276; H01L 27/3262; H01L 27/3258; H01L 27/3223; H01L 27/3265
  USPC ........................................................ 257/180
  See application file for complete search history.

(56) References Cited

U.S. PATENT DOCUMENTS

| | | | |
|---|---|---|---|
| 6,850,294 B2 | 2/2005 | Roh et al. |
| 6,933,671 B2 | 8/2005 | Nakanishi |
| 7,202,606 B2 | 4/2007 | Eom et al. |
| 7,253,865 B2 | 8/2007 | Battersby |
| 7,570,327 B2 | 8/2009 | Motoshima et al. |
| 7,579,624 B2 | 8/2009 | Takasugi et al. |
| 7,772,766 B2 | 8/2010 | Aoki |
| 7,830,591 B2 | 11/2010 | Shimodaira |
| 7,911,423 B2 | 3/2011 | Kim et al. |
| 8,004,480 B2 | 8/2011 | Kim et al. |
| 8,089,596 B2 | 1/2012 | Koma et al. |
| 8,325,116 B2 | 12/2012 | Takasugi et al. |
| 8,350,972 B2 | 1/2013 | Taneda et al. |
| 8,363,191 B2 | 1/2013 | Yoshida |
| 8,379,004 B2 | 2/2013 | Han et al. |
| 8,477,250 B2 | 7/2013 | Schellingerhout et al. |
| 8,665,249 B2 | 3/2014 | Suh |
| 8,736,525 B2 | 5/2014 | Kawabe |
| 8,867,004 B2 | 10/2014 | Chang |
| 9,190,005 B2 | 11/2015 | Watsuda et al. |
| 9,201,258 B2 | 12/2015 | Kim et al. |
| 9,231,000 B2 | 1/2016 | Ko et al. |
| 9,305,508 B2 | 4/2016 | Park et al. |
| 9,368,058 B2 | 6/2016 | Omata et al. |
| 9,450,040 B2 | 9/2016 | Kim et al. |
| 9,716,132 B2 | 7/2017 | Kinoshita |
| 9,767,767 B2 | 9/2017 | Kong et al. |
| 9,852,686 B2 | 12/2017 | So et al. |
| 10,115,780 B2 | 10/2018 | Kim et al. |
| 10,229,964 B2 | 3/2019 | Kim et al. |
| 10,354,578 B2 | 7/2019 | Ka et al. |
| 10,403,193 B2 | 9/2019 | Kim et al. |
| 10,418,597 B2 | 9/2019 | Li et al. |
| 10,490,119 B2 | 11/2019 | Kim et al. |
| 10,490,122 B2 | 11/2019 | Kim et al. |
| 10,504,446 B2 | 12/2019 | Kim et al. |
| 10,516,016 B2 | 12/2019 | Kim et al. |
| 10,636,859 B2 | 4/2020 | Park et al. |
| 10,748,472 B2 | 8/2020 | Kim et al. |
| 11,257,896 B2 | 2/2022 | Park et al. |
| 2003/0030630 A1 | 2/2003 | Bayot et al. |
| 2003/0151568 A1 | 8/2003 | Ozawa |
| 2004/0012744 A1 | 1/2004 | Ishige et al. |
| 2004/0032557 A1 | 2/2004 | Lee et al. |
| 2004/0125258 A1 | 7/2004 | Moon et al. |
| 2005/0243259 A1 | 11/2005 | Song et al. |
| 2006/0066644 A1 | 3/2006 | Yamaguchi et al. |
| 2006/0221288 A1 | 10/2006 | Ota et al. |
| 2006/0244387 A1 | 11/2006 | Park et al. |
| 2006/0290618 A1 | 12/2006 | Goto |
| 2007/0080433 A1 | 4/2007 | Lai |
| 2008/0049177 A1 | 2/2008 | Motoshima et al. |
| 2008/0088568 A1 | 4/2008 | Haga et al. |
| 2008/0218450 A1 | 9/2008 | Park |
| 2009/0102758 A1 | 4/2009 | Anzai et al. |
| 2009/0102824 A1 | 4/2009 | Tanaka et al. |
| 2009/0295843 A1 | 12/2009 | Dunn |
| 2009/0303260 A1 | 12/2009 | Takasugi |
| 2009/0303404 A1 | 12/2009 | Kretz |
| 2010/0020059 A1 | 1/2010 | Suh |
| 2010/0039604 A1 | 2/2010 | Kim |
| 2010/0073335 A1 | 3/2010 | Min et al. |
| 2010/0109994 A1 | 5/2010 | Lee et al. |
| 2010/0177024 A1 | 7/2010 | Choi |
| 2010/0187533 A1 | 7/2010 | Chang |
| 2010/0238368 A1 | 9/2010 | Kim et al. |
| 2011/0084955 A1 | 4/2011 | Kim |
| 2012/0112988 A1 | 5/2012 | Nakanishi et al. |
| 2012/0268476 A1 | 10/2012 | Park |
| 2012/0293496 A1 | 11/2012 | Park et al. |
| 2013/0106817 A1 | 5/2013 | Gang et al. |
| 2013/0257309 A1 | 10/2013 | Ikeda |
| 2013/0314611 A1 | 11/2013 | Okutsu et al. |
| 2014/0291686 A1 | 10/2014 | Wang |
| 2014/0313439 A1 | 10/2014 | Matsumoto |
| 2015/0022513 A1 | 1/2015 | Kim |
| 2015/0055036 A1 | 2/2015 | Weber et al. |
| 2015/0069348 A1 | 3/2015 | Tae |
| 2015/0228699 A1 | 8/2015 | Cho et al. |
| 2015/0294618 A1 | 10/2015 | Park et al. |
| 2015/0325593 A1 | 11/2015 | Shih et al. |
| 2015/0331290 A1 | 11/2015 | Jung et al. |
| 2015/0379930 A1 | 12/2015 | Lee et al. |
| 2016/0012768 A1 | 1/2016 | In et al. |
| 2016/0027380 A1 | 1/2016 | Kim et al. |
| 2016/0035811 A1 | 2/2016 | Choi et al. |
| 2016/0086977 A1 | 3/2016 | Go et al. |
| 2016/0111040 A1* | 4/2016 | Kim ................... G09G 3/2096 257/773 |
| 2016/0190166 A1 | 6/2016 | Kim et al. |
| 2016/0019856 A1 | 7/2016 | Tanaka et al. |
| 2016/0240141 A1 | 8/2016 | Lee et al. |
| 2016/0293108 A1 | 10/2016 | Park et al. |
| 2016/0321992 A1 | 11/2016 | Kim et al. |
| 2016/0321996 A1 | 11/2016 | Lee et al. |
| 2016/0322453 A1 | 11/2016 | Park et al. |
| 2017/0177115 A1 | 6/2017 | Chung et al. |
| 2017/0249896 A1 | 8/2017 | Kim et al. |
| 2017/0301280 A1 | 10/2017 | Ka et al. |
| 2018/0005585 A1 | 1/2018 | Kim et al. |
| 2018/0075804 A1 | 3/2018 | Kim et al. |
| 2018/0082630 A1 | 3/2018 | Kim et al. |
| 2018/0090061 A1 | 3/2018 | Kim et al. |
| 2018/0145093 A1 | 5/2018 | Xi et al. |
| 2018/0151660 A1 | 5/2018 | Kim et al. |
| 2018/0151663 A1 | 5/2018 | Kim et al. |
| 2018/0240856 A1 | 8/2018 | Kim et al. |
| 2019/0035876 A1 | 1/2019 | Kim et al. |
| 2020/0098310 A1 | 3/2020 | Kim et al. |

FOREIGN PATENT DOCUMENTS

| | | |
|---|---|---|
| CN | 1656530 A | 8/2005 |
| CN | 1700289 A | 11/2005 |
| CN | 1836269 A | 9/2006 |
| CN | 101101419 A | 1/2008 |

(56) References Cited

FOREIGN PATENT DOCUMENTS

| | | |
|---|---|---|
| CN | 101401143 A | 4/2009 |
| CN | 101443695 A | 5/2009 |
| CN | 101536064 A | 9/2009 |
| CN | 101561992 A | 10/2009 |
| CN | 101578649 A | 11/2009 |
| CN | 101800024 A | 8/2010 |
| CN | 101313349 A | 12/2010 |
| CN | 102254917 A | 11/2011 |
| CN | 102396020 A | 3/2012 |
| CN | 102789755 A | 11/2012 |
| CN | 202583659 U | 12/2012 |
| CN | 103579221 A | 2/2014 |
| CN | 103941446 A | 7/2014 |
| CN | 104077998 A | 10/2014 |
| CN | 104898340 A | 9/2015 |
| CN | 105161049 A | 12/2015 |
| CN | 105204248 A | 12/2015 |
| CN | 105225629 A | 1/2016 |
| CN | 106098727 A | 11/2016 |
| CN | 106711180 A | 5/2017 |
| CN | 107871767 A | 4/2018 |
| EP | 1063630 A2 | 12/2000 |
| EP | 2085952 A1 | 8/2009 |
| EP | 3232431 A1 | 10/2017 |
| EP | 3264405 A2 | 1/2018 |
| JP | 2003-150082 A | 5/2003 |
| JP | 2003-248442 A | 9/2003 |
| JP | 2004-69993 A | 3/2004 |
| JP | 2005-062464 A | 3/2005 |
| JP | 2006-65284 A | 3/2006 |
| JP | 2007-232981 A | 9/2007 |
| JP | 2008-26435 A | 2/2008 |
| JP | 2008-129243 A | 6/2008 |
| JP | 2009-75194 A | 4/2009 |
| JP | 2010-282224 A | 12/2010 |
| KR | 10-2006-0031548 A | 4/2006 |
| KR | 10-0672792 B1 | 1/2007 |
| KR | 10-2008-0060886 | 7/2008 |
| KR | 10-2009-0005651 A | 1/2009 |
| KR | 10-2009-0059335 A | 6/2009 |
| KR | 10-2010-0010594 A | 2/2010 |
| KR | 10-1054327 B1 | 8/2011 |
| KR | 10-1064425 | 9/2011 |
| KR | 10-1101070 B1 | 12/2011 |
| KR | 10-2012-0110887 A | 10/2012 |
| KR | 10-2014-0018623 A | 2/2014 |
| KR | 10-1376654 | 3/2014 |
| KR | 10-1416529 | 7/2014 |
| KR | 10-1432126 | 8/2014 |
| KR | 10-2014-0108023 A | 9/2014 |
| KR | 10-2016-0082770 A | 7/2016 |
| KR | 10-2016-0099770 A | 8/2016 |
| KR | 10-2017-0102147 A | 9/2017 |
| KR | 10-2017-0119270 A | 10/2017 |
| KR | 10-2018-0003747 | 1/2018 |
| KR | 10-2018-0029133 | 3/2018 |
| KR | 10-2018-0033373 A | 4/2018 |
| KR | 10-2018-0050372 A | 5/2018 |
| KR | 10-2018-0061565 | 6/2018 |
| TW | M366088 U1 | 10/2009 |
| TW | 201109786 A1 | 3/2011 |
| WO | WO 2007/069187 A2 | 6/2007 |
| WO | WO 2017/172375 A1 | 10/2017 |

OTHER PUBLICATIONS

"Brightness Control Technology of Electronic Display", Computer & Telecommunication, International cooperation project recommendation, China Academic Journal Electronic Publishing House, 2013, p. 25, with an English machine translation.
Chinese Office Action dated Feb. 10, 2023, issued in Chinese Patent Application No. 201810151517.9 (7 pages).
U.S. Notice of Allowance dated Sep. 1, 2022, issued in U.S. Appl. No. 17/575,548 (31 pages).
Uchida, Yoshihiro et al., "Parasitic Capacitance Modeling for TFT Liquid Crystal Displays," 33rd Conference on European Solid-State Device Research, Oct. 2004, 4 pages.
Zhou, Lei et al., "Design Analysis of Large Size Metal Oxide TFT Panel," Chinese Journal of Luminescence, vol. 36, No. 5, May 2015, 6 pages.
EPO Partial Search Report dated Oct. 25, 2017, corresponding to European Patent Application No. 17178307.9 (31 pages).
Chinese Office Action dated Oct. 9, 2020, issued in Chinese Patent Application No. 201710515778.X (11 pages).
EPO Office action dated Jun. 3, 2019, corresponding to European Patent Application No. 17166354.5 (10 pages).
EPO Extended Search Report dated Jun. 27, 2018, corresponding to European Patent Application No. 18157710.7 (7 pages).
European Result of consultation on Jul. 13, 2020 issued in European Patent Application No. 17166354.5, which is corresponding to U.S. Pat. No. 10,354,578.
U.S. Office Action dated May 17, 2018, issued in U.S. Appl. No. 15/398,391 (16 pages).
U.S. Office Action dated May 17, 2018, issued in U.S. Appl. No. 15/434,196 (15 pages).
U.S. Office Action dated Jan. 11, 2019, issued in U.S. Appl. No. 15/712,657 (25 pages).
U.S. Office Action dated Apr. 1, 2020, issued in U.S. Appl. No. 16/805,635 (18 pages).
U.S. Office Action dated Oct. 1, 2020, issued in U.S. Appl. No. 16/859,917 (11 pages).
U.S. Notice of Allowance dated Mar. 9, 2021, issued in U.S. Appl. No. 16/805,635 (10 pages).
U.S. Notice of Allowance dated Apr. 14, 2021, issued in U.S. Appl. No. 16/298,924 (13 pages).
U.S. Office Action dated May 13, 2021, issued in U.S. Appl. No. 16/995,615 (30 pages).
EPO Extended European Search Report dated Jun. 14, 2021, issued in European Patent Application No. 21164738.3 (12 pages).
Chinese Office Action for CN Application No. 201711223025.8 dated Jun. 21, 2022, 9 pages.
Final Rejection for U.S. Appl. No. 15/611,297 dated Dec. 13, 2018, 7 pages.
Korean Notice of Allowance for KR Patent Application No. 10-2017-0063718 dated Apr. 8, 2022, 2 pages.
Notice of Allowance for U.S. Appl. No. 15/611,297 dated Apr. 22, 2019, 10 pages.
Notice of Allowance for U.S. Appl. No. 15/611,297 dated Jul. 31, 2019, 10 pages.
Notice of Allowance for U.S. Appl. No. 15/832,628 dated Oct. 25, 2018, 11 pages.
Notice of Allowance for U.S. Appl. No. 16/298,924 dated Apr. 14, 2021, 12 pages.
Notice of Allowance for U.S. Appl. No. 16/298,924 dated Jul. 29, 2021, 12 pages.
Notice of Allowance for U.S. Appl. No. 16/298,924 dated Nov. 25, 2020, 13 pages.
Notice of Allowance for U.S. Appl. No. 16/298,924 dated Oct. 14, 2021, 12 pages.
Notice of Allowance for U.S. Appl. No. 16/708,396 dated Apr. 28, 2021, 8 pages.
Notice of Allowance for U.S. Appl. No. 16/708,396 dated Aug. 9, 2021, 8 pages.
Notice of Allowance for U.S. Appl. No. 16/708,396 dated Oct. 7, 2020, 8 pages.
Notice of Allowance for U.S. Appl. No. 16/805,635 dated Aug. 6, 2020, 9 pages.
Notice of Allowance for U.S. Appl. No. 16/805,635 dated Jul. 22, 2021, 9 pages.
Notice of Allowance for U.S. Appl. No. 16/805,635 dated Oct. 28, 2021, 9 pages.
Notice of Allowance for U.S. Appl. No. 16/859,917 dated Jan. 13, 2021, 8 pages.
Notice of Allowance for U.S. Appl. No. 16/859,917 dated Jun. 29, 2021, 8 pages.
Notice of Allowance for U.S. Appl. No. 16/859,917 dated Oct. 12, 2021, 8 pages.

(56) References Cited

OTHER PUBLICATIONS

Notice of Allowance for U.S. Appl. No. 16/995,615 dated Sep. 3, 2021, 8 pages.
Office Action for U.S. Appl. No. 15/611,297 dated May 25, 2018, 11 pages.
Office Action for U.S. Appl. No. 16/708,396 dated Jun. 25, 2020, 7 pages.
Office Action for U.S. Appl. No. 16/805,635 dated Nov. 23, 2020, 14 pages.
Chinese Office Action dated Nov. 14, 2022, issued in Chinese Patent Application No. 201710866523.8 (9 pages).
U.S. Office Action dated Apr. 12, 2023, issued in U.S. Appl. No. 17/676,052 (16 pages).
U.S. Notice of Allowance dated Jan. 19, 2023, issued in U.S. Appl. No. 17/575,548 (18 pages).
Chinese Office Action dated Oct. 17, 2022, issued in Chinese Patent Application No. 201711225931.1 (8 pages).
Chinese Office Action dated May 9, 2023, issued in Chinese Patent Application No. 201710115808.8 (16 pages).
U.S. Office Action dated May 4, 2023, issued in U.S. Appl. No. 17/537,237 (10 pages).
U.S. Notice of Allowance dated Oct. 13, 2023, issued in U.S. Appl. No. 17/676,052 (9 pages).

* cited by examiner

DISPLAY DEVICE WITH PROTECTION AGAINST ELECTROSTATIC DISCHARGE

CROSS-REFERENCE TO RELATED APPLICATIONS

This application is a continuation of U.S. patent application Ser. No. 16/723,970, filed Dec. 20, 2019, which is a continuation of U.S. patent application Ser. No. 16/152,316, filed Oct. 4, 2018, now U.S. Pat. No. 10,516,016, which is a continuation of U.S. patent application Ser. No. 15/721,353, filed Sep. 29, 2017, now U.S. Pat. No. 10,115,780, which claims priority to and the benefit of Korean Patent Application No. 10-2016-0160814, filed Nov. 29, 2016, the entire content of all of which is incorporated herein by reference.

BACKGROUND

1. Field

An aspect of the present disclosure relates to a display device.

2. Description of the Related Art

A display device includes an active region in which an image is displayed. The active region includes a plurality of pixels for emitting light with a luminance corresponding to input data and a plurality of lines for transmitting driving signals to the pixels.

Recently, as demand for display devices having various shapes increases, the shape of an active region has been variously implemented. Therefore, lengths of lines may be different for each region even in the active region. If the lengths of the lines are different, the lines have different load values. Therefore, luminance deviations between the pixels at different locations in the active region may occur, and the luminance deviations may cause degradation in the image quality.

SUMMARY

Aspects of embodiments of the present disclosure are directed to a display device having a structure that protects against electrostatic discharge (ESD) while displaying images having uniform image quality.

According to an aspect of the present disclosure, there is provided a display device including: a substrate including a first display region having a first width in a first direction, a second display region having a second width smaller than the first width in the first direction, a peripheral region at a periphery of the first and second display regions, and a dummy region in the peripheral region; a first pixel in the first display region; a second pixel in the second display region; a first control line connected to the first pixel, the first control line extending along the first direction in the first display region; a second control line connected to the second pixel, the second control line extending along the first direction in the second display region; and a dummy line connected to the second control line, the dummy line being in the dummy region, wherein the second control line is at a first conductive layer on a first insulating layer, the first insulating layer is on the substrate, and the dummy line is at a second conductive layer on a second insulating layer, the second insulating layer being on the first conductive layer.

In some embodiments, the display device further includes a conductive bridge connecting the second control line and the dummy line.

In some embodiments, the conductive bridge is at one side of the second display region.

In some embodiments, the conductive bridge is at one side of the dummy region.

In some embodiments, the second pixel is connected to a plurality of second control lines to which different signals are applied, and a plurality of dummy lines connected to different second control lines among the plurality of second control lines are in the dummy region.

In some embodiments, a second control line and a corresponding dummy line among the second control lines and the dummy lines, are connected to each other by one of first conductive bridges at one side of the second display region, and another second control line and another dummy line corresponding to the other second control line, among the second control lines and the dummy lines, are connected to each other by one of second conductive bridges at one side of the dummy region.

In some embodiments, ones of the dummy lines connected to the first conductive bridges at one side of the second display region and ones of the dummy lines connected to the second conductive bridges at one side of the dummy region are alternately arranged in the dummy region.

In some embodiments, the display device further includes a power supply line in the peripheral region, the power supply line at least partially overlapping with the dummy line.

In some embodiments, the power supply line includes: an active pattern between the substrate and the first insulating layer; and a main bus line at a third conductive layer on a third insulating layer, the third insulating layer being on the second conductive layer, the main bus line being connected to the active pattern through a contact opening.

In some embodiments, a thickness of the third insulating layer is greater than a thickness of the first insulating layer and a thickness of the second insulating layer.

In some embodiments, the thickness of the third insulating layer is equal to or greater than a sum of the thickness of the first insulating layer and the thickness of the second insulating layer.

In some embodiments, the power supply line includes: a plurality of active patterns between the substrate and the first insulating layer, the plurality of active patterns extending in a direction crossing the dummy line; a main bus line at a third conductive layer on a third insulating layer, the third insulating layer being on the second conductive layer, the main bus line overlapping with the active patterns; and a plurality of contact openings at an edge of the dummy region, the plurality of contact openings facilitating electrical connections between the active patterns and the main bus line.

In some embodiments, the second pixel includes at least one transistor connected to the second control line.

In some embodiments, the transistor includes: an active pattern between the substrate and the first insulating layer; a source electrode and a drain electrode connected to the active pattern; and a gate electrode overlapping with the active pattern on the first conductive layer, the first conductive layer being on the first insulating layer, the gate electrode being connected to the second control line.

In some embodiments, the gate electrode is integrally connected to the second control line.

In some embodiments, the second pixel includes at least one capacitor including a first electrode at the first conductive layer and a second electrode at the second conductive layer.

In some embodiments, the second control line includes at least one of a scan line, a light emitting control line, and an initialization control line of the second pixel.

In some embodiments, the first pixel and the second pixel have a same structure.

In some embodiments, the peripheral region includes a first peripheral region surrounding at least one region of the first display region and a second peripheral region surrounding at least one region of the second display region, and the dummy region is in the second peripheral region.

In some embodiments, the display device further includes: a third display region having a third width smaller than the first width in the first direction; a third pixel in the third display region; a third control line connected to the third pixel, the third control line extending along the first direction in the third display region; and a dummy line connected to the third control line, the dummy line being in the dummy region.

In some embodiments, the second control line and the dummy line are formed of a same material.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing, dimensions may be exaggerated for clarity of illustration. Like reference numerals refer to like elements throughout.

DETAILED DESCRIPTION

Figure 1:
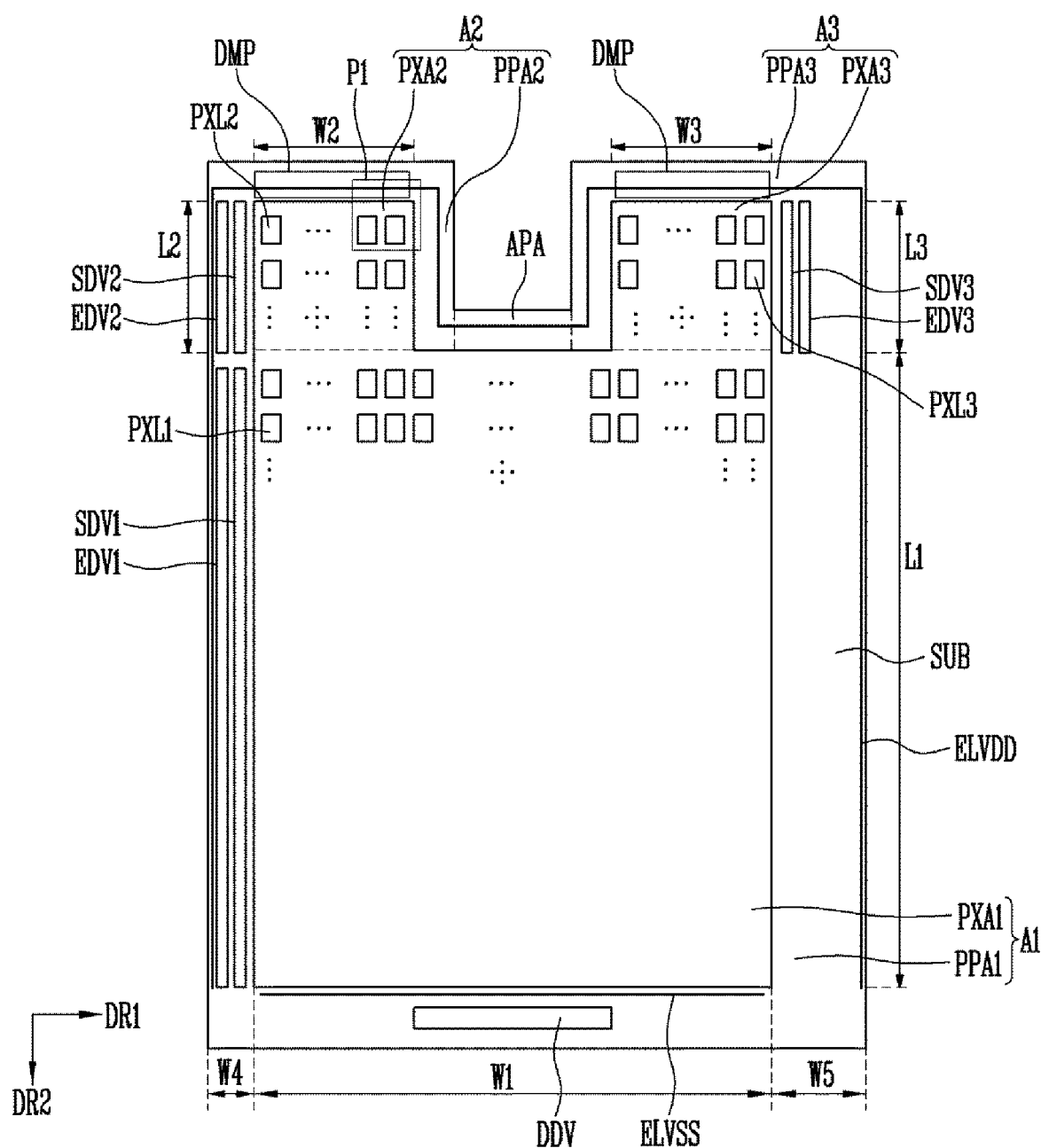
FIGS. 1-2 illustrate a display device according to an embodiment of the present disclosure.

Hereinafter, exemplary embodiments of the present disclosure will be described in detail with reference to the accompanying drawings. However, the present disclosure is not limited to the embodiments but may be implemented into different forms. These embodiments are provided for illustrative purposes and for full understanding of the scope of the present disclosure by those skilled in the art.

In the following embodiments and the attached drawings, elements not directly related to the present disclosure may be omitted from drawings, and dimensional relationships among individual elements in the attached drawings are illustrated only for ease of understanding but not to limit the actual scale. It should be noted that in giving reference numerals to elements of each drawing, like reference numerals refer to like elements even though like elements are shown in different drawings.

Figure 2:
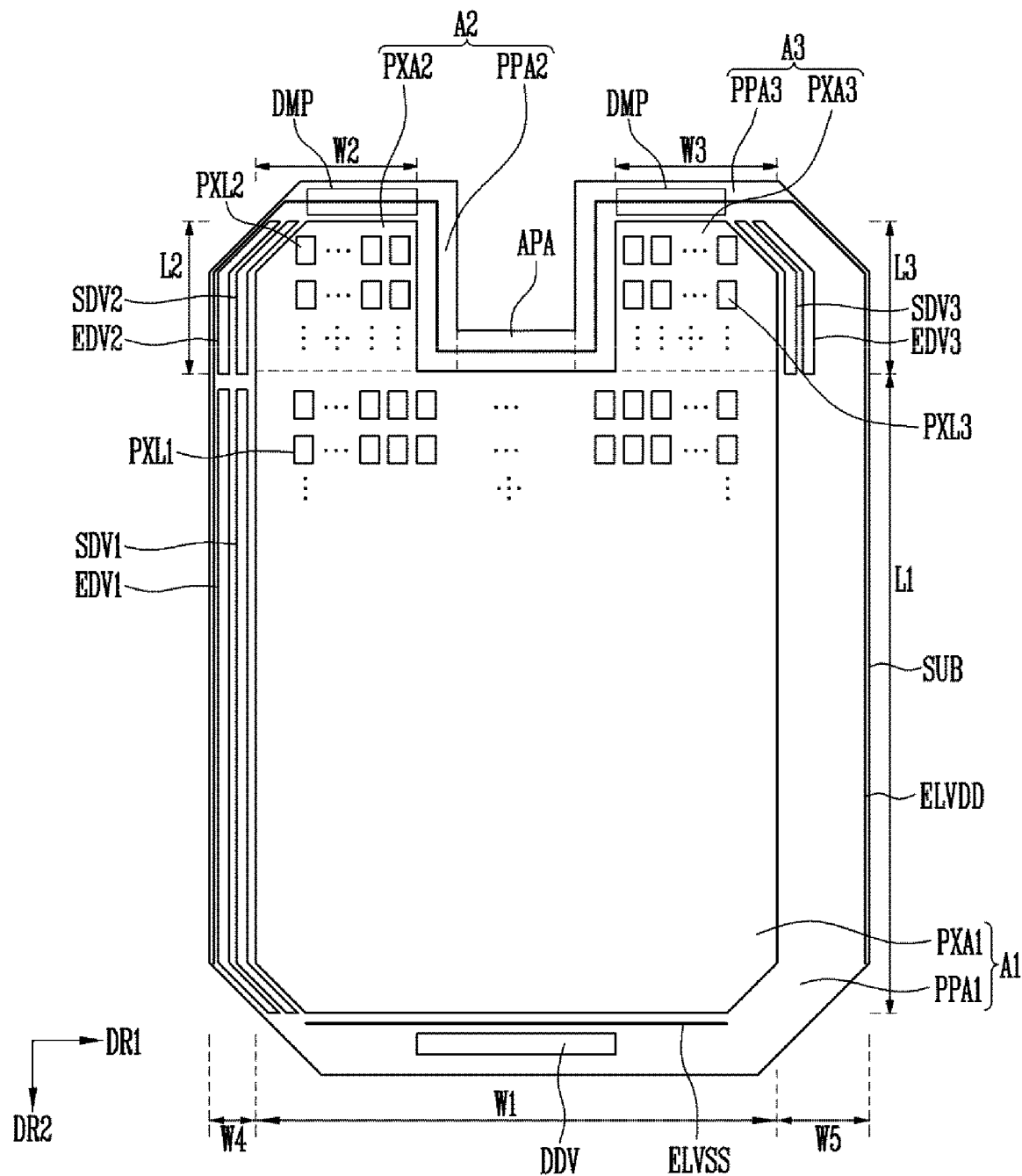

FIGS. 1 and 2 illustrate a display device according to an embodiment of the present disclosure. FIG. 2 is a modification of FIG. 1, and illustrates an embodiment in which, for example, shapes of a substrate and an active region are modified.

Referring to FIGS. 1 and 2, the display device according to the embodiment of the present disclosure includes a substrate SUB including a plurality of display regions PXA1, PXA2, and PXA3 (hereinafter, referred to as "PXA"), peripheral regions PPA1, PPA2, and PPA3 (hereinafter, referred to as "PPA"), and at least one dummy region DMP provided in at least some of the peripheral regions PPA; pixels PXL1, PXL2, and PXL3 (hereinafter, referred to as "PXL") provided in the display regions PXA; and drivers SDV1, SDV2, SDV3, EDV1, EDV2, EDV3, and DDV and power supply lines ELVDD and ELVSS, which are provided in the peripheral regions PPA on the substrate SUB.

In some embodiments, the substrate SUB may be a glass substrate or plastic substrate; however, the present disclosure is not limited thereto. For example, the substrate SUB may be a flexible substrate including polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), cellulose acetate propionate (CAP), and/or the like. In some examples, the substrate SUB may be a rigid substrate including one material selected from glass or tempered glass. In some examples, the substrate SUB may be a substrate made of a transparent material, that is, a transmissive substrate; however, the present disclosure is not limited thereto.

In some embodiments, the substrate SUB may include a plurality of regions, and at least two of the regions may have different areas. For example, the substrate SUB may include first to third regions A1, A2, and A3, and the first region A1 may have a different area from the second area A2 and the third area A3. The second area A2 and the third area A3 may have the same area or different areas. A case where the substrate SUB is divided into three regions A1, A2, and A3 is illustrated in this embodiment, however, the number of regions divided on the substrate SUB is not limited thereto.

Each of the first to third regions A1, A2, and A3 may have various suitable shapes. For example, each of the first to third regions A1, A2, and A3 may be provided in various suitable shapes, such as a polygon having a plurality of linear sides, a circle, an ellipse, a shape having curved sides, a semicircle, a semi-ellipse, and a shape having both linear and curved sides. In addition, at least one of the first to third regions A1, A2, and A3 may have an oblique, a stepped, or a curved corner portion. For example, as shown in FIG. 2, at least one corner portion of the first to third regions A1, A2, and A3 may have an obliquely inclined corner.

In some embodiments, the display regions PXA1, PXA2, PXA3, the drivers SDV1, SDV2, SDV3, EDV1, EDV2, EDV3, and DDV, the power supply lines ELVDD and ELVSS, and/or the dummy region DMP, which are included in the first to third regions A1, A2, and A3, may have shapes corresponding to those of the first to third regions A1, A2, and A3. That is, the shapes of the first to third regions A1, A2, and A3 and components provided in the first to third regions A1, A2 are not particularly limited, and may be variously changed, as suitable, and implemented.

In some embodiments, the first to third regions A1, A2, and A3 may include one or more display regions PXA1, PXA2, and PXA3, and peripheral regions PPA1, PPA2, and PPA3 (hereinafter, referred to as "PPA") are disposed at the periphery of the display regions PXA1, PXA2, and PXA3 to be adjacent to the display regions PXA1, PXA2, and PXA3, respectively. That is, the display device according to the embodiment of the present disclosure may include a plurality of display regions PXA1, PXA2, and PXA3. Pixels PXL1, PXL2, and PXL3 are provided in the display regions PXA1, PXA2, and PXA3, and the display regions PXA1, PXA2, and PXA3 constitute an active region (screen region) in which an image is displayed.

In some embodiments, the display regions PXA1, PXA2, and PXA3 may be continuously disposed to implement one continuous screen. In some embodiments, at least two of the display regions PXA1, PXA2, and PXA3 may be discretely disposed (e.g., separated from one another) with one or more peripheral regions PPA interposed therebetween to implement divided screens.

The peripheral regions PPA are regions in which no image is displayed and in which the pixels PXL are not provided (e.g., a region in which no pixels exist). The drivers SDV1, SDV2, SDV3, EDV1, EDV2, EDV3, and DDV for driving the pixels PXL, the power supply lines ELVDD and ELVSS for applying power sources to the pixels PXL, some of lines for connecting the pixels PXL and the drivers SDV1, SDV2, SDV3, EDV1, EDV2, EDV3, and DDV, and/or the dummy region DMP may be provided in the peripheral regions PPA. The peripheral regions PPA correspond to a bezel in a final display device, and a width of the bezel may be determined according to widths of the peripheral regions PPA.

In some embodiments, the first region A1 may have the largest area among the first to third regions A1, A2, and A3. The first region A1 may include a first display region PXA1 in which an image is displayed, and a first peripheral region PPA1 surrounding at least one portion of the first display region PXA1.

In some embodiments, the first display region PXA1 may be provided in a shape corresponding to that of the first region A1. In an embodiment of the present disclosure, at least one region of the first display region PXA1 may have a first width W1 in a first direction DR1. In some embodiments, the first display region PXA1 may have a first length L1 in a second direction DR2 crossing the first direction DR1. For example, the first display region PXA1 may be implemented in a quadrangular shape having a lateral length corresponding to the first width W1 and a longitudinal length corresponding to the first length L1. However, the shape and/or size of the first display region PXA1 is/are not limited thereto. For example, when at least one region of the first display region PXA1 implemented in a curved, oblique, or stepped shape, the first display region PXA1 may have a width gradually increasing or decreasing in the corresponding region.

A plurality of first pixels PXL1 are provided in the first display region PXA1. The first pixels PXL1 may be implemented in various suitable shapes, and an exemplary configuration of the first pixels PXL1 will be described later.

In some embodiments, the first peripheral region PPA1 may be provided at at least one side of the first display region PXA1. In an embodiment of the present disclosure, the first peripheral region PPA1 surrounds the circumference of the first display region PXA1, and may be provided at a portion except portions at which the second region A2 and the third region A3, which will be described later, are disposed. That is, the first peripheral region PPA1 may be provided at the periphery of the first display region PXA1 to surround at least one portion of the first display region PXA1.

In some embodiments, the first peripheral region PPA1 may include a lateral part extending in the first direction DR1 and a longitudinal part extending in the second direction DR2. The longitudinal part of the first peripheral region PPA1 may be provided in a pair spaced apart from each other along the first direction DR1 with the first display region PXA1 interposed therebetween. For example, the longitudinal part of the first peripheral region PPA1 may be provided in a pair located at left and right sides (or opposite sides) of the first display region PXA1.

At least one driver for driving the first pixels PXL1, for example, a first scan driver SDV1 and a first light emitting control driver EDV1 may be provided in the first peripheral region PPA1. Although the first scan driver SDV1 and the first light emitting control driver EDV1 are provided on the substrate SUB in this embodiment, the present disclosure is not limited thereto. For example, at least one of the first scan driver SDV1 and the first light emitting control driver EDV1 may be provided at the outside of the substrate SUB to be electrically connected to the first pixels PXL1 via a pad unit. In addition, the first light emitting control driver EDV1 may not be provided according to a configuration of the first pixels PXL1. In FIGS. 1 and 2, it has been illustrated that each of the first scan driver SDV1 and the first light emitting control driver EDV1 is provided at only one side of the first display region PXA1; however, the present disclosure is not limited thereto. For example, in another embodiment, the first scan driver SDV1 and the first light emitting control driver EDV1 may be disposed at both sides of the first display region PXA1. In some embodiments, the first scan driver SDV1 and the first light emitting control driver EDV1 may be disposed at different sides of the first display region PXA1, respectively.

In some embodiments, the first peripheral region PPA1 may have a symmetric shape with respect to the first display region PXA1; however, the present disclosure is not limited thereto. For example, a width W4 of the first peripheral region PPA1 disposed at the left side of the first display region PXA1 may be different from a width W5 of the first peripheral region PPA1 disposed at the right side of the first display region PXA1.

In some embodiments, the second region A2 may include a second display region PXA2 in which an image is displayed, and a second peripheral region PPA2 disposed at the periphery of the second display region PXA2 to surround at least one portion of the second display region PXA2.

In some embodiments, the second display region PXA2 may be provided in a shape corresponding to that of the second region A2. In an embodiment of the present disclosure, at least one region of the second display region PXA2 may have a second width W2 in the first direction DR1. In some embodiments, the second display region PXA2 may have a second length L2 in the second direction DR2 crossing the first direction DR1. For example, the second display region PXA2 may be implemented in a quadrangular shape having a lateral length corresponding to the second width W2 and a longitudinal length corresponding to the second length L2. However, the shape and/or size of the second display region PXA2 is/are not limited thereto. For example, when at least one region of the second display region PXA2 implemented in a curved, oblique, or stepped shape, the second display region PXA2 may have a width gradually increasing or decreasing in the corresponding region.

In some embodiments, the second width W2 of the second display region PXA2 may be smaller than the first width W1 of the first display region PXA1. In some embodiments, the second length L2 of the second display region PXA2 may be smaller than the first length L1 of the first display region PXA1. That is, in some embodiments, the second display region PXA2 may have a smaller area than the first display region PXA1.

In some embodiments, the second display region PXA2 is provided in a shape protruding from the first display region PXA1, and may be continuously connected to the first display region PXA1. That is, one side of the second display region PXA2 may be in contact with one side of the first display region PXA1.

A plurality of second pixels PXL2 are provided in the second display region PXA2. In some embodiments, each of the second pixels PXL2 may be configured to be substantially identical to each of the first pixels PXL1; however, the present disclosure is not limited thereto.

In some embodiments, the second peripheral region PPA2 may be provided at at least one side of the second display region PXA2. In an embodiment of the present disclosure, the second peripheral region PPA2 surrounds the second display region PXA2, and may not be provided at a portion to which the first display region PXA1 and the second display region PXA2 are connected. That is, the second peripheral region PPA2 may be disposed at the periphery of the second display region PXA2 to surround at least one portion of the second display region PXA2. In some embodiments, the second peripheral region PPA2 may include a lateral part extending in the first direction DR1 and a longitudinal part extending in the second direction DR2. The longitudinal part of the second peripheral region PPA2 may be provided in a pair spaced apart from each other in the first direction DR1 with the second display region PXA2 interposed therebetween. For example, the longitudinal part of the second peripheral region PPA2 may be provided in a pair located at left and right sides (or opposite sides) of the second display region PXA2.

At least one driver for driving the second pixels PXL2, for example, a second scan driver SDV2 and a second light emitting control driver EDV2 may be provided in the second peripheral region PPA2. Although the second scan driver SDV2 and the second light emitting control driver EDV2 are provided on the substrate SUB in this embodiment, the present disclosure is not limited thereto. For example, at least one of the second scan driver SDV2 and the second light emitting control driver EDV2 may be provided at the outside of the substrate SUB to be electrically connected to the second pixels PXL2 via the pad unit. In addition, the second light emitting control driver EDV2 may not be provided according to a configuration of the second pixels PXL2. In FIGS. 1 and 2, it has been illustrated that each of the second scan driver SDV2 and the second light emitting control driver EDV2 is provided at only one side of the second display region PXA2; however, the present disclosure is not limited thereto. For example, in another embodiment, the second scan driver SDV2 and the second light emitting control driver EDV2 may be disposed at both sides of the second display region PXA2. In some embodiments, the second scan driver SDV2 and the second light emitting control driver EDV2 may be disposed at different sides of the second display region PXA2, respectively.

In some embodiments, the third region A3 may include a third display region PXA3 in which an image is displayed, and a third peripheral region PPA3 disposed at the periphery of the third display region PXA3 to surround at least one portion of the third display region PXA3.

In some embodiments, the third display region PXA3 may be provided in a shape corresponding to that of the third region A3. In an embodiment of the present disclosure, at least one region of the third display region PXA3 may have a third width W3 in the first direction DR1. In some embodiments, the third display region PXA3 may have a third length L3 in the second direction DR2 crossing the first direction DR1. For example, the third display region PXA3 may be implemented in a quadrangular shape having a lateral length corresponding to the third width W3 and a longitudinal length corresponding to the third length L3. However, the shape and/or size of the third display region PXA3 is/are not limited thereto. For example, when at least one region of the third display region PXA3 implemented in a curved, oblique, or stepped shape, the third display region PXA3 may have a width gradually increasing or decreasing in the corresponding region.

In some embodiments, the third width W3 of the third display region PXA3 may be smaller than the first width W1 of the first display region PXA1. In some embodiments, the third length L3 of the third display region PXA3 may be smaller than the first length L1 of the first display region PXA1. That is, in some embodiments, the third display region PXA3 may have a smaller area than the first display region PXA1.

In some embodiments, the third width W3 of the third display region PXA3 may be equal to the second width W2 of the second display region PXA2; however, the present disclosure is not limited thereto. In some embodiments, the third length L3 of the third display region PXA3 may be equal to the second length L2 of the second display region PXA2; however, the present disclosure is not limited thereto. That is, in some embodiments, the third display region PXA3 may have the same area as the second display region PXA2; however, the present disclosure is not limited thereto.

In some embodiments, the third display region PXA3 is provided in a shape protruding from the first display region PXA1, and may be continuously connected to the first display region PXA1. That is, one side of the third display region PXA3 may be in contact with one side of the first display region PXA1. In some embodiments, the third display region PXA3 may be disposed to be spaced apart from the second display region PXA2 at a set or predetermined distance. For example, the second display region PXA2 may be provided in a shape protruding at an upper left side of the first display region PXA1, and the third display region PXA3 may be provided in a shape protruding at an upper right side of the first display region PXA1, and the second display region PXA2 and the third display region PXA3 may be connected via an additional peripheral region APA located among the first to third display regions PXA1, PXA2, and PXA3.

A plurality of third pixels PXL3 are provided in the third display region PXA3. In some embodiments, each of the third pixels PXL3 may be configured to be substantially identical to each of the first pixels PXL1 and/or the second pixels PXL2; however, the present disclosure is not limited thereto.

In some embodiments, the third peripheral region PPA3 may be provided at at least one side of the third display region PXA3. In an embodiment of the present disclosure, the third peripheral region PPA3 surrounds the third display region PXA3, and may not be provided at a portion to which the first display region PXA1 and the third display region PXA3 are connected. That is, the third peripheral region PPA3 may be disposed at the periphery of the third display region PXA3 to surround at least one portion of the third display region PXA3. In some embodiments, the third peripheral region PPA3 may include a lateral part extending in the first direction DR1 and a longitudinal part extending in the second direction DR2. The longitudinal part of the third peripheral region PPA3 may be provided in a pair spaced apart from each other in the first direction DR1 with the third display region PXA3 interposed therebetween. For example, the longitudinal part of the third peripheral region PPA3 may be provided in a pair located at left and right sides (or opposite sides) of the third display region PXA3.

At least one driver for driving the third pixels PXL3, for example, a third scan driver SDV3 and a third light emitting control driver EDV3 may be provided in the third peripheral region PPA3. Although the third scan driver SDV3 and the third light emitting control driver EDV3 are provided on the substrate SUB in this embodiment, the present disclosure is not limited thereto. For example, at least one of the third scan driver SDV3 and the third light emitting control driver EDV3 may be provided at the outside of the substrate SUB to be electrically connected to the third pixels PXL3 via the pad unit. In addition, the third light emitting control driver EDV3 may not be provided according to a configuration of the third pixels PXL3. In FIGS. 1 and 2, it has been illustrated that each of the third scan driver SDV3 and the third light emitting control driver EDV3 is provided at only one side of the third display region PXA3; however, the present disclosure is not limited thereto. For example, in another embodiment, the third scan driver SDV3 and the third light emitting control driver EDV3 may be disposed at both sides of the third display region PXA3. In some embodiments, the third scan driver SDV3 and the third light emitting control driver EDV3 may be disposed at different sides of the third display region PXA3, respectively.

In an embodiment of the present disclosure, the third region A3 may have a shape linearly symmetric to the second region A2 with respect to a vertical center line extending along the second direction DR2 at a central point of the lateral part of the first peripheral region PPA1 of the first region A1. In this case, an arrangement relation of components provided in the third region A3 may be substantially identical to that in the second region A2 except for some lines.

Therefore, the substrate SUB may have a shape in which the second region A2 and the third region A3 protrude in the second direction DR2 in the first region A1. In addition, because the second region A2 and the third region A3 are spaced apart from each other, the substrate SUB may have a shape depressed between the second region A2 and the third region A3. That is, the substrate SUB may have a notch between the second region A2 and the third region A3.

In an embodiment of the present disclosure, the longitudinal parts of the first peripheral region PPA1 may be connected to portions of the longitudinal parts of the second peripheral region PPA2 and the third peripheral region PPA3, respectively. For example, the left longitudinal part of the first peripheral region PPA1 may be connected to the left longitudinal part of the second peripheral region PPA2. In some embodiments, the left longitudinal part of the first peripheral region PPA1 and the left longitudinal part of the second peripheral region PPA2 may have the same width W4 (hereinafter, referred to as the "fourth width"). In addition, the right longitudinal part of the first peripheral region PPA1 and the right longitudinal part of the third peripheral region PPA3 may have the same width W5 (hereinafter, referred to as the "fifth width"). In some embodiments, the fourth width W4 and the fifth width W5 may be different from each other. For example, the fourth width W4 may be smaller than the fifth width W5.

In an embodiment of the present disclosure, the substrate SUB may further include an additional peripheral region APA. The additional peripheral region APA may be provided adjacent to the first display region PXA1, the second peripheral region PPA2, and the third peripheral region PPA3. For example, the additional peripheral region APA may connect the second peripheral region PPA2 and the third peripheral region PPA3. For example, the additional peripheral region APA may connect the second peripheral region PPA2 and the third peripheral region PPA3 at an upper end of one region of the first display region PXA1.

In some embodiments, each of the pixels PXL provided in the display regions PXA on the substrate SUB, that is, the first to third display regions PXA1, PXA2, and PXA3 may include a display element which emits light. For example, each of the pixels PXL may include an organic light emitting diode (OLED). However, the present disclosure is not limited to an organic light emitting display device to which the OLED is applied. That is, the pixels PXL may be implemented as pixels of another type of display device.

In some embodiments, each of the pixels PXL may emit light having one color among red, green, and blue; however, the present disclosure is not limited thereto. For example, each of the pixels PXL may emit light having a color of cyan, magenta, yellow, white, or the like.

In some embodiments, a data driver DDV may be provided in the peripheral region PPA. For example, the data driver DDV may be provided in the first peripheral region PPA1. However, the present disclosure is not limited thereto. For example, the data driver DDV may be provided at the outside of the substrate SUB to be electrically connected to the first pixels PXL, the second pixels PXL2, and/or the third pixels PXL3 via the pad unit.

In some embodiments, at least one power supply line may be further provided in the peripheral region PPA. For example, first and second power supply lines ELVDD and ELVSS for respectively supplying first and second power sources to the first display region PXA1, the second display region PXA2, and/or the third display region PXA2 may be disposed in the peripheral region PPA. In addition, one or more power supply lines, for example, initialization power supply lines for supplying a third power source may be further provided according to a structure of the pixels PXL.

In some embodiments, one of the first power supply line ELVDD and the second power supply line ELVSS, for example, the second power supply line ELVSS, may be disposed to correspond to one side of the first peripheral region PPA1, one side of the second peripheral region PPA2, and/or one side of the third peripheral region PPA3. For example, the second power supply line ELVSS may be disposed in a region in which the data driver DDV of the first peripheral region PPA1 is disposed, for example, at a lower end of the first display region PXA1. In some embodiments, the second power supply line ELVSS may extend along the first direction DR1 in the first peripheral region PPA1.

In some embodiments, the other of the first power supply line ELVDD and the second power supply line ELVSS, for example, the first power supply line ELVDD may be disposed in the peripheral region PPA except the region in which the second power supply line ELVSS is disposed. For example, the first power supply line ELVDD may be disposed to surround the first display region PXA1, the second display region PXA2, and the third display region PXA3. For example, the first power supply line ELVDD may have a shape extending along the left longitudinal part of the first peripheral region PPA1, the second peripheral region PPA2, the additional peripheral region APA, the third peripheral region PPA3, and the right longitudinal part of the first peripheral region PPA1.

In the above-described embodiment, a case where the second power supply line ELVSS is disposed corresponding to one side of the first display region PXA1 in the first peripheral region PPA1 and the first power supply line ELVDD is disposed in the other peripheral regions PPA has been described as an example; however, the present disclosure is not limited thereto. For example, the first power supply line ELVDD and the second power supply line ELVSS may be disposed to surround the first display region PXA1, the second display region PXA2, and the third display region PXA3.

In some embodiments, a voltage applied through the first power supply line ELVDD may be higher than that applied through the second power supply line ELVSS. For example, a high-potential pixel power source may be applied through the first power supply line ELVDD, and a low-potential pixel power source may be applied through the second power supply line ELVSS. However, the kind of power source applied through the first power supply line ELVDD and/or the second power supply line ELVSS is not limited thereto.

The power supply lines ELVDD and ELVSS may be electrically connected between the pad unit and the first display region PXA1, the second display region PXA2, and/or the third display region PXA3. Therefore, the power supply lines ELVDD and ELVSS may transmit a set or predetermined power supplied from the outside to the first display region PXA1, the second display region PXA2, and/or the third display region PXA3.

In an embodiment of the present disclosure, a dummy region DMP may be located in one region of the peripheral region PPA. The dummy region DMP includes a dummy line that forms a parasitic capacitance so as to compensate for a difference in luminance between the pixels PXL disposed in the display region PXA.

For example, the display device according to the embodiment of the present disclosure includes at least two display regions PXA having different widths. That is, in some embodiments, numbers of the first pixels PXL, the second pixels PXL2, and/or the third pixels PXL3, disposed on one row in the first display region PXA1, the second display region PXA2, and/or the third display region PXA3, may be different for each region.

For example, one row of the first display region PXA1 having the first width W1 may have a length corresponding to the first width W1, and one row of the second display region PXA2 having the second width W2 may have a length corresponding to the second width W2. Therefore, second control lines disposed on each row of the second display region PXA2, for example, scan lines of the second display region PXA2, may have a shorter length than first control lines disposed on each row of the first display region PXA1, for example, scan lines of the first display region PXA1. In addition, a number of second pixels PXL2 electrically connected to the control lines disposed on each row of the second display region PXA2 may be smaller than that of first pixels PXL1 electrically connected to the control lines disposed on each row of the first display region PXA1. Hence, the first control lines and the second control lines have different load values. Therefore, as a difference in luminance between the first pixel PXL1 and the second pixels PXL2 occurs, the display of images may become non-uniform.

In some embodiments, numbers of first pixels PXL1, second pixels PXL2, and/or the third pixels PXL3, disposed on one row, may be different even in the first display region PXA1, the second display region PXA2, and the third display region PXA3. For example, when at least one region of each of the first display region PXA1, the second display region PXA2, and the third display region PXA3 has an oblique or curved shape, lengths of control lines disposed on each row and/or numbers of first pixels PXL1, second pixels PXL2, and/or the third pixels PXL3, connected to the control lines, may be different even in the first display region PXA1, the second display region PXA2, and the third display region PXA3 according to shapes of the first display region PXA1, the second display region PXA2, and the third display region PXA3.

Accordingly, in an embodiment of the present disclosure, a dummy region DMP is disposed in the peripheral region PPA, and dummy lines are formed in the dummy region DMP, so that a difference between load values of the lines is compensated. For example, a dummy region DMP is disposed in each of the second peripheral region PPA2 and the third peripheral region PPA3, and dummy lines connected to the second peripheral region PPA2 and the third peripheral region PPA3 may be formed in the respective dummy regions DMP. In some embodiments, the dummy lines may be designed such that load values of first control lines connected to the first pixels PXL1, second control lines connected to the second pixels PXL2, and third control lines connected to the third pixels PXL3 become similar (e.g., substantially the same). The dummy lines may overlap with at least one power supply line, for example, the first power supply line ELVDD to form a parasitic capacitance. Accordingly, it is possible to compensate for a difference between load values of the first pixels PXL and the second or third pixels PXL2 or PXL3. Thus, according to the embodiment of the present disclosure, the image quality of images can be improved.

That is, in an embodiment of the present disclosure, as the dummy region DMP is provided or is not provided in the peripheral region PPA corresponding to each display region PXA so as to compensate for a difference between load values for each display region PXA, structures having different parasitic capacitances may be provided. In an embodiment of the present disclosure, the dummy region DMP may be disposed in each of the second peripheral region PPA2 and the third peripheral region PPA; however, the present disclosure is not limited thereto. The dummy region will be described in more detail later.

As described above, the dummy region DMP may overlap with at least one power supply line, for example, the first power supply line ELVDD. However, in order to stably drive the display device, electrical stability (e.g., resulting from insulation properties) is to be ensured between the first power supply line ELVDD and the dummy lines connected to the control lines of the second or third display region PXA2 or PXA3. Therefore, in an embodiment of the present disclosure which will be described later, there is provided a display device capable of preventing or reducing the incidence of a short circuit between the first power supply line ELVDD and the dummy lines disposed in the second and third peripheral regions PPA2 and PPA3, into which ESD is relatively easily introduced. An embodiment related to this will be described in more detail later.

Figure 3:
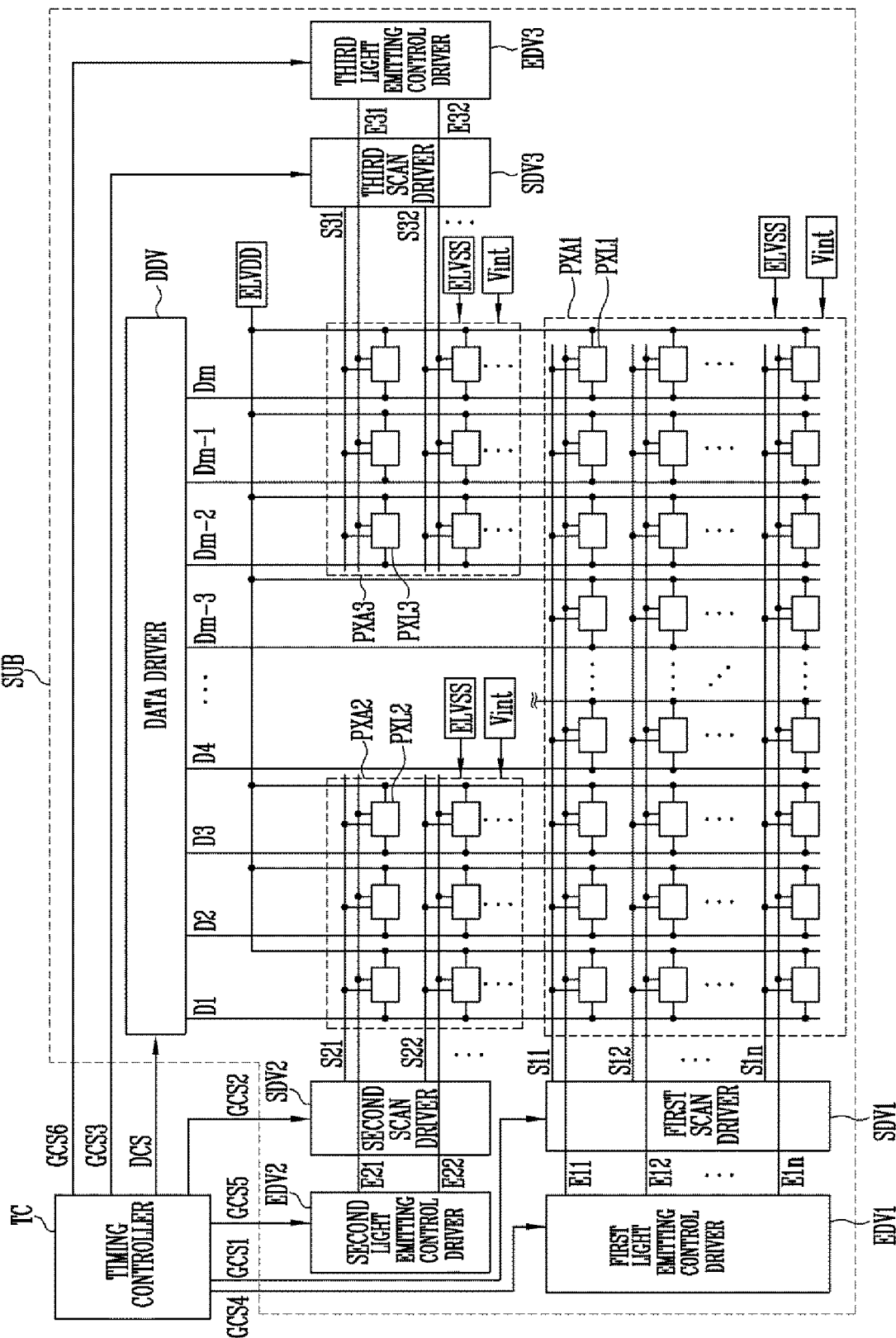
FIG. 3 illustrates an embodiment of display regions and drivers in the display device shown in FIG. 1.

FIG. 3 illustrates an embodiment of the display regions and the drivers in the display device shown in FIG. 1. For convenience, in FIG. 3, ELVDD as a first power source uses the same reference numeral as the first power source line ELVDD of FIG. 1, and ELVSS as a second power source uses the same reference numeral as the second power supply line ELVSS of FIG. 1. Generally, in FIG. 3, components similar to or identical to those of FIG. 2 are designated by like reference numerals, and their detailed descriptions may not be repeated.

Hereinafter, display regions and drivers according to an embodiment of the present disclosure will be described in more detail with reference to FIG. 3 in conjunction with FIGS. 1 and 2.

Referring to FIGS. 1 to 3, the display device according to the embodiment of the present disclosure may include pixels PXL, drivers SDV1, SDV2, SDV3, EDV1, EDV2, EDV3, DDV, and TC, and conductive lines.

In some embodiments, the pixels PXL may include first to third pixels PXL1, PXL2, and PXL3, and the drivers SDV1, SDV2, SDV3, EDV1, EDV2, EDV3, DDV, and TC may include first to third scan drivers SDV1, SDV2, and SDV3, first to third light emitting control drivers EVD1, EDV2, and EDV3, a data driver DDV, and a timing controller TC. In FIG. 3, positions of the first to third scan drivers SDV1, SDV2, and SDV3, the first to third light emitting control drivers EDV1, EDV2, and EDV3, the data driver DDV, and the timing controller TC are set for convenience of description. When an actual display device is implemented, the first to third scan drivers SDV1, SDV2, and SDV3, the first to third light emitting control drivers EDV1, EDV2, and EDV3, the data driver DDV, and the timing controller TC may be disposed at other suitable positions in the display device. For example, it has been illustrated that the data driver DDV is disposed in a region closer to a second region A2 and a third region A3 than a first region A1; however, the position of the data driver DDV may be changed. For example, the data driver DDV may be disposed in a region adjacent to the first region A1.

The conductive lines transmit driving signals from the drivers SDV1, SDV2, SDV3, EDV1, EDV2, EDV3, DDV, and TC to the pixels PXL. The conductive lines may include scan lines S11 to S1n, S21, S22, S31, and S32, data lines D1 to Dm, light emitting control lines E11 to E1n, E21, E22, E31, and E32, a first power supply line ELVDD, a second power supply line ELVSS, and an initialization power line.

In some embodiments, the scan lines S11 to S1n, S21, S22, S31, and S32 may include first to third scan lines S11 to S1n, S21, S22, S31, and S32, and the light emitting control lines E11 to E1n, E21, E22, E31, and E32 may include first to third light emitting control lines E11 to E1n, E21, E22, E31, and E32 respectively connected to the first to third pixels PXL1, PXL2, and PXL3. The data lines D1 to Dm and the first and second power supply lines ELVDD and ELVSS may be connected to the first to third pixels PXL1, PXL2, and PXL3.

The first pixels PXL1 are disposed in a first display region PXA1, and may be connected to the first scan lines S11 to S1n, the first light emitting control lines E11 to E1n, and the data lines D1 to Dm. The first pixels PXL1 are supplied with a data signal from the data lines D1 to Dm when a scan signal is supplied from the first scan lines S11 to S1n. Each of the first pixels PXL1 supplied with the data signal may control (or affect) the amount of current flowing from the first power source ELVDD to the second power source ELVSS via an organic light emitting diode OLED.

The second pixels PXL2 are disposed in a second display region PXA2, and may be connected to the second scan lines S21 and S22, the second light emitting control lines E21 and E22, and the data lines D1 to D3. For convenience, the second pixels PXL2 connected to two second scan lines S21 and S22, two second light emitting control lines E21 and E22, and three data lines D1 to D3 are illustrated in FIG. 3, the number and positions of the second pixels PXL2 are not limited thereto. Each of the second pixels PXL2 is supplied with a data signal from one of the data lines D1 to D3 when a scan signal is supplied from one of the second scan lines S21 and S22. Each of the second pixels PXL2 supplied with the data signal may control (or affect) the amount of current flowing from the first power source ELVDD to the second power source ELVSS via an organic light emitting diode OLED.

The third pixels PXL3 are disposed in a third display region PXA3, and may be connected to the third scan lines S31 and S32, the third light emitting control lines E31 and E32, and the data lines Dm-2 to Dm. For convenience, although the third pixels PXL3 connected to two third scan lines S31 and S32, two third light emitting control lines E31 and E32, and three data lines Dm-2 to Dm are illustrated in FIG. 3, the number and positions of the third pixels PXL3 are not limited thereto. Each of the third pixels PXL3 is supplied with a data signal from one of the data lines Dm-2 to Dm when a scan signal is supplied from one of the third scan lines S31 and S32. Each of the third pixels PXL3 supplied with the data signal may control (or affect) the amount of current flowing from the first power source ELVDD to the second power source ELVSS via an organic light emitting diode OLED.

The first scan driver SDV1 may supply a scan signal to the first scan lines S11 to S1n in response to a first gate control signal GCS1 from the timing controller TC. For example, the first scan driver SDV1 may sequentially supply the scan signal to the first scan lines S11 to S1n. If the scan signal is sequentially supplied to the first scan lines S11 to S1n, the first pixels PXL1 may be sequentially selected in units of horizontal lines.

The second scan driver SDV2 may supply a scan signal to the second scan lines S21 and S22 in response to a second gate control signal GCS2 from the timing controller TC. For example, the second scan driver SDV2 may sequentially supply the scan signal to the second scan lines S21 and S22. If the scan signal is sequentially supplied to the second scan lines S21 and S22, the second pixels PXL2 may be sequentially selected in units of horizontal lines.

The third scan driver SDV3 may supply a scan signal to the third scan lines S31 and S32 in response to a third gate control signal GCS3 from the timing controller TC. For example, the third scan driver SDV3 may sequentially supply the scan signal to the third scan lines S31 and S32. If the scan signal is sequentially supplied to the third scan lines S31 and S32, the third pixels PXL3 may be sequentially selected in units of horizontal lines.

The first light emitting control driver EDV1 may supply a light emitting control signal to the first light emitting control lines E11 to E1n in response to a fourth gate control signal GCS4. For example, the first light emitting control driver EDV1 may sequentially supply the light emitting control signal to the first light emitting control lines E11 to E1n. Here, the light emitting control signal may have a greater width than the scan signal (e.g., the light emitting control signal may be applied for a longer period of time than the scan signal). For example, a light emitting control signal supplied to an ith (where i is a natural number) first light emitting control line E1i may be supplied to overlap with, for at least one period, a scan signal supplied to an (i−1)th first scan line S1i−1 and a scan signal supplied to an ith first scan line S1i. In some embodiments, the light emitting control signal may be set to a gate-off voltage (e.g., a high voltage) such that transistors included in the pixels PXL can be turned off, and the scan signal may be set to a gate-on voltage (e.g., a low voltage) such that the transistors included in the pixels PXL can be turned on.

The second light control emitting driver EDV2 may supply a light emitting control signal to the second light emitting control lines E21 and E22 in response to a fifth gate control signal GCS5. For example, the second light emitting control driver EDV2 may sequentially supply the light emitting control signal to the second light emitting control lines E21 and E22.

The third light emitting control driver EDV3 may supply a light emitting control signal to the third light emitting control lines E31 and E32 in response to a sixth gate control signal GCSE. For example, the third light emitting control driver EDV3 may sequentially supply the light emitting control signal to the third light emitting control lines E31 and E32.

The data driver DDV may supply a data signal to the data lines D1 to Dm in response to a data control signal DCS. The data signal supplied to the data lines D1 to Dm may be supplied to pixels PXL selected by the scan signal.

The timing controller TC may supply, to the scan drivers SDV and the light emitting drivers EDV, the gate control signals GCS1 to GCS6 generated based on timing signals supplied from the outside. Also, the timing controller TC may supply the data control signal DCS and image data to the data driver DDV.

The timing controller TC may be connected to the first to third scan drivers SDV1, SDV2, and SDV3, the first to third light emitting control drivers EDV1, EDV2, and EDV3, and the data driver DDV through the lines in various suitable manners. The position at which the timing controller TC is not particularly limited. For example, the timing controller TC may be mounted on a flexible printed circuit board to be connected to the first to third scan drivers SDV1, SDV2, and SDV3, the first to third light emitting control drivers EDV1, EDV2, and EDV3, and the data driver DDV through the printed circuit board. In some embodiments, the printed circuit board may be disposed at various suitable positions such as one side of the substrate SUB and a back surface of the substrate SUB.

A start pulse and clock signals may be included in each of the gate control signals GCS1 to GCS6 output from the timing controller TC. The start pulse may control a supply timing of a first scan signal or first light emitting control signal. The clock signals may be used to shift the start pulse.

A source start pulse and clock signals may be included in the data control signal DCS output from the timing controller TC. The source start pulse may control a sampling start time of data. The color signals may be used to control a sampling operation.

As described above, in the display device according to the embodiment of the present disclosure, the pixels PXL may be provided in the regions A1, A2, and A3 having different areas. Lengths of the scan lines S11 to S1n, S21, S22, S31, and S32 and the light emitting control lines E11 to E1n, E21, E22, E31, and E32, which provide signals to the pixels PXL, may be changed depending on the regions A1, A2, and A3, for example, areas of the display regions PXA1, PXA2, and PXA3. For example, the first width W1 of the first display region PXA1 is longer than the second width W2 of the second display region PXA2. Accordingly, when the scan lines S11 to S1n, S21, S22, S31, and S32 and the light emitting control lines E11 to E1n, E21, E22, E31, and E32 extend along the width direction thereof, the length of each of the first scan lines S11 to S1n and the first light emitting control lines E11 to E1n is longer than that of each of the second scan lines S21 and S22 and the second light emitting control lines E21 and E22. In addition, each of the first scan lines S11 to S1n and the first light emitting control lines E11 to E1n may be connected to a larger number of pixels PXL than each of the second scan lines S21 and S22 and the second light emitting control lines E21 and E22.

A difference in length between the scan lines S11 to S1n, S21, S22, S31, and S32, a difference in length between the light emitting control lines E11 to E1n, E21, E22, E31, and E32, and/or a number of pixels PXL connected thereto may cause a difference between load values of the scan lines S11 to S1n, S21, S22, S31, and S32 and a difference between load values of the light emitting control lines E11 to E1n, E21, E22, E31, and E32 for the respective regions A1, A2, and A3. That is, a load value of the first scan lines S11 to S1n may be greater than that of the second scan lines S21 and S22. In addition, a load value of the first light emitting control lines E11 to E1n may be greater than that of the second light emitting control lines E21 and E22. Such a difference between load values may cause a difference (or deviation) in luminance between the first pixels PXL1 provided in the first display region PXA1 and the second pixels PXL2 provided in the second display region PXA2. In an embodiment of the present disclosure, the third pixels PXL3 provided in the third display region PXA3 may be provided in the substantially same form as the second pixels PXL2, and therefore, a detailed description of the third pixels PXL3 may not be repeated.

Figure 4:
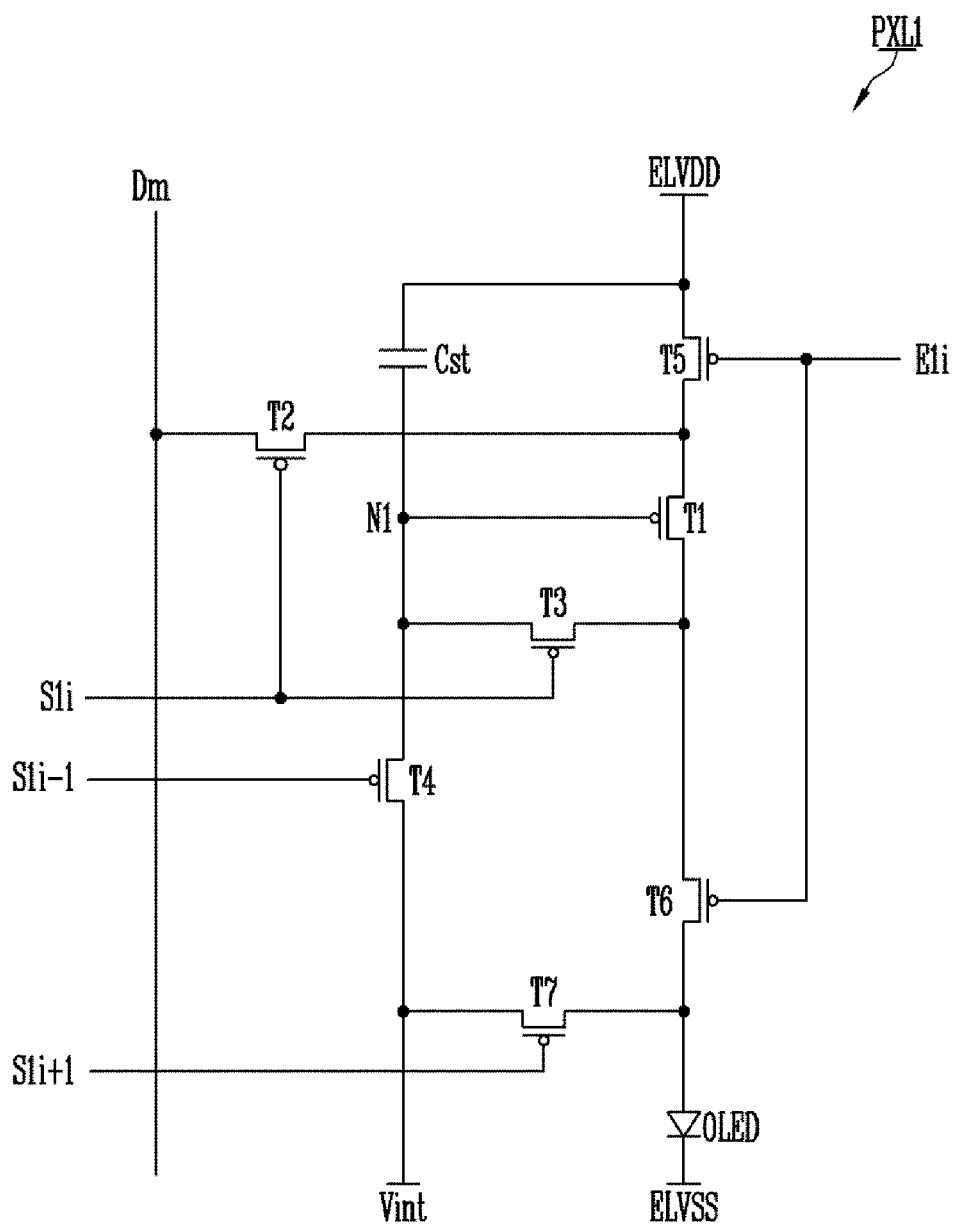
FIG. 4 illustrates a first pixel according to an embodiment of the present disclosure.

FIG. 4 illustrates a first pixel according to an embodiment of the present disclosure. For convenience of description, a pixel connected to an mth data line Dm and an ith first scan line S1i has been illustrated in FIG. 4.

Referring to FIGS. 3 and 4, the first pixel PXL1 according to the embodiment of the present disclosure may include an organic light emitting diode OLED, first to seventh transistors T1 to T7, and a storage capacitor Cst.

An anode electrode of the organic light emitting diode OLED may be connected to the first transistor T1 via the sixth transistor T6, and a cathode electrode of the organic light emitting diode OLED may be connected to the second power source ELVSS. The organic light emitting diode OLED generates light with a set or predetermined luminance corresponding to the amount of current supplied from the first transistor T1. A voltage of the first power source ELVDD may be set higher than that of the second power source ELVSS such that the current can flow through the organic light emitting diode OLED.

The seventh transistor T7 may be connected between an initialization power source Vint and the anode electrode of the organic light emitting diode OLED. In addition, a gate electrode of the seventh transistor T7 may be connected to an (i+1)th first scan line S1i+1. The seventh transistor T7 may be turned on when a scan signal is supplied to the (i+1)th first scan line S1i+1, to supply a voltage of the initialization power source to the anode electrode of the organic light emitting diode OLED. Here, the voltage of the initialization power source Vint may be set to a lower voltage than a data signal. That is, the voltage of the initialization power source Vint may be set to not more than a minimum voltage of the data signal. In this embodiment, a case where an anode initialization control line connected to the gate electrode of the seventh transistor T7 is the (i+1)th first scan line S1i+1 has been illustrated as an example; however, the present disclosure is not limited thereto. For example, in another embodiment, the gate electrode of the seventh transistor T7 may be connected to the ith first scan line S1i. In this case, the voltage of the initialization power source Vint may be supplied to the anode electrode of the organic light emitting diode OLED via the seventh transistor T7 when a scan signal is supplied to the ith first scan line S1i.

The sixth transistor T6 may be connected between the first transistor T1 and the organic light emitting diode OLED. In addition, a gate electrode of the sixth transistor T6 may be connected to an ith first light emitting control line E1i. The sixth transistor T6 may be turned off when a light emitting control signal (e.g., a light emitting control signal having a gate-off voltage (high-level voltage)) is supplied to the ith first light emitting control line E1i, and turned on otherwise.

The fifth transistor T5 may be connected between the first power source ELVDD and the first transistor T1. In addition, a gate electrode of the fifth transistor T5 may be connected to the ith first light emitting control line E1i. The fifth transistor T5 may be turned off when the light emitting control signal is supplied to the ith first light emitting control line E1i, and turned on otherwise.

A first electrode of the first transistor (driving transistor) T1 may be connected to the first power source ELVDD via the fifth transistor T5, and a second electrode of the first transistor T1 may be connected to the anode electrode of the organic light emitting diode OLED. In addition, a gate electrode of the first transistor T1 may be connected to a first node N1. The first transistor T1 may control the amount of current flowing from the first power source ELVDD to the second power source ELVSS via the organic light emitting diode OLED, corresponding to a voltage of the first node N1.

The third transistor T3 may be connected between the second electrode of the first transistor T1 and the first node N1. In addition, a gate electrode of the third transistor T3 may be connected to the ith first scan line S1i. The third transistor T3 may be turned on when the scan signal is supplied to the ith first scan line S1i, to allow the second electrode of the first transistor T1 and the first node N1 to be electrically connected to each other. Therefore, when the third transistor T3 is turned on, the first transistor T1 may be diode-connected.

The fourth transistor T4 may be connected between the first node N1 and the initialization power source Vint. In addition, a gate electrode of the fourth transistor T4 may be connected to an (i−1)th first scan line S1i−1. The fourth transistor T4 may be turned on when the scan signal is supplied to the (i−1)th first scan line S1i−1, to supply the voltage of the initialization power source Vint to the first node N1. In this embodiment, the (i−1)th first scan line S1i−1 may be used as an initialization control line for initializing a gate node of the first transistor T1, that is, the first node N1. However, the present disclosure is not limited thereto. For example, in another embodiment, another control line such as an (i−2)th first scan line S1i−2 may be used as the initialization control line for initializing the gate node of the first transistor T1.

The second transistor T2 may be connected to the mth (where m is a natural number) data line Dm and the first electrode of the first transistor T1. In addition, a gate electrode of the second transistor T2 may be connected to the ith first scan line S1i. The second transistor T2 may be turned on when the scan signal is supplied to the ith first scan line S1i, to allow the mth data line Dm and the first electrode of the first transistor T1 to be electrically connected to each other.

The storage capacitor Cst may be connected between the first power source ELVDD and the first node N1. The storage capacitor Cst may store the data signal and a voltage corresponding to a threshold voltage of the first transistor T1.

The structure of the first pixel PXL1 is not limited to the embodiment shown in FIG. 4. For example, it will be apparent that pixel circuits having various suitable structures known in the art may be applied to the first pixel PXL1.

In a non-restrictive embodiment related to the present disclosure, each of the second pixel PXL2 and the third pixel PXL3 may be implemented with the same or substantially the same circuit as the first pixel PXL1. Therefore, a detailed description of the structure of each of the second pixel PXL2 and the third pixel PXL3 may not be repeated.

Figure 5:
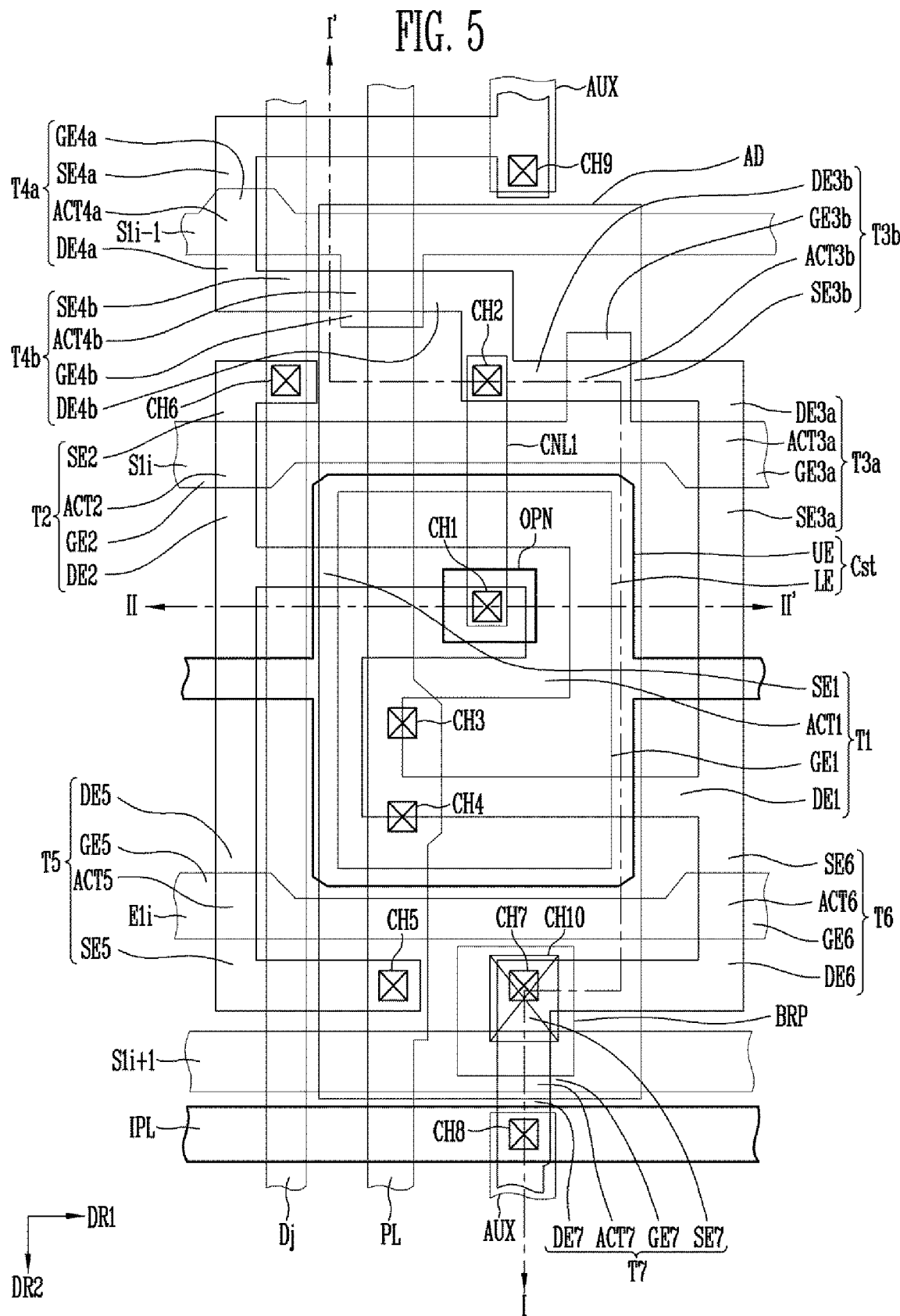
FIG. 5 illustrates a detailed structure of an embodiment of the first pixel shown in FIG. 4.
Figure 6:
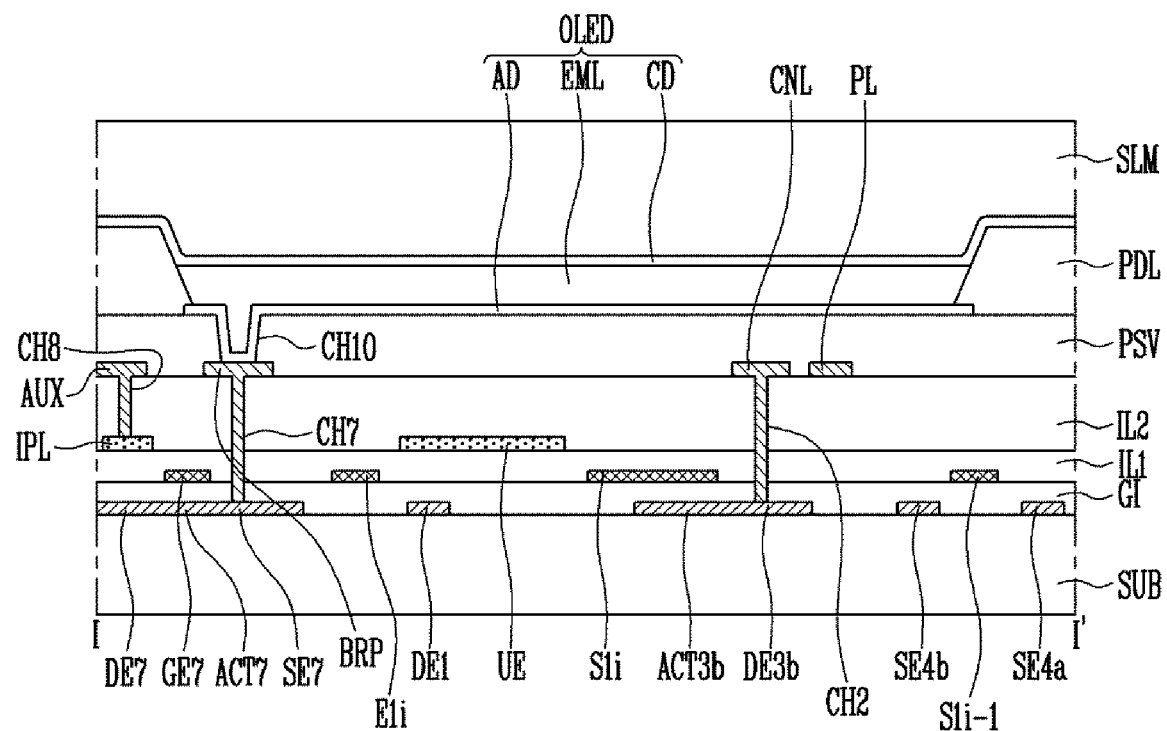
FIG. 6 illustrates a section taken along the line I-I' of FIG. 5.
Figure 7:
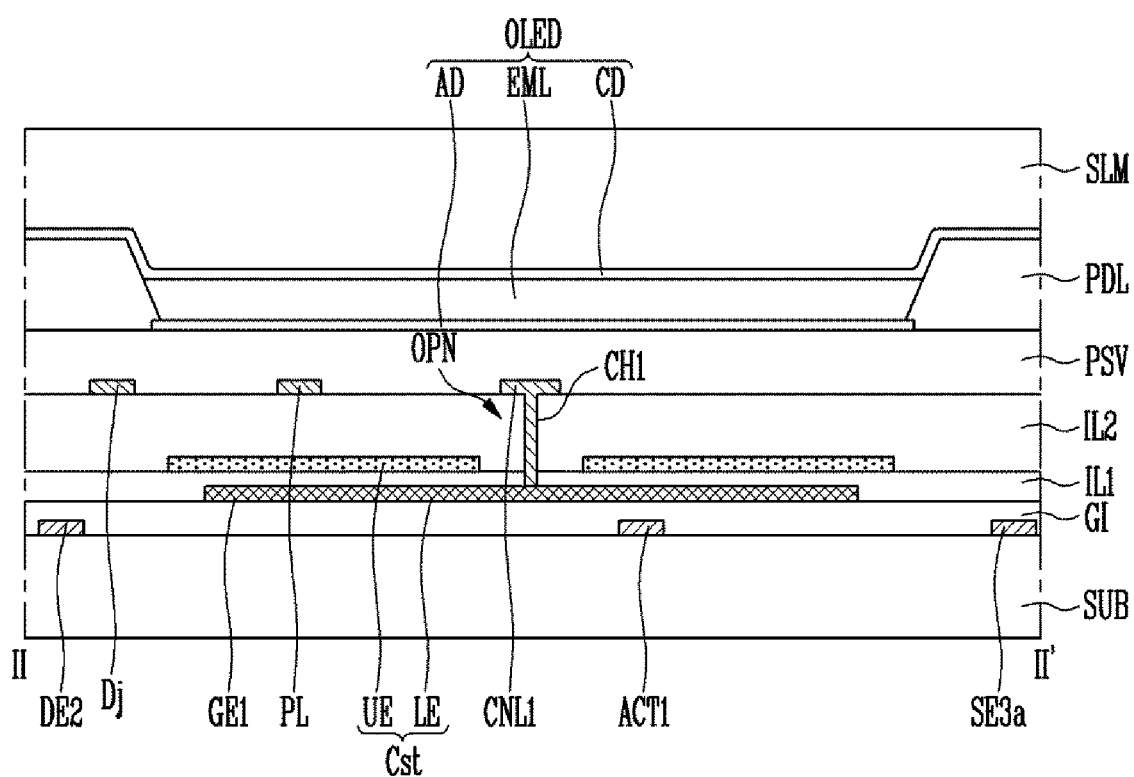
FIG. 7 illustrates a section taken along the line II-II' of FIG. 5.

FIG. 5 illustrates an embodiment of a detailed structure of the first pixel shown in FIG. 4. Particularly, FIG. 5 is a plan view illustrating in detail a layout embodiment of the first pixel shown in FIG. 4. FIG. 6 illustrates a section taken along the line I-I' of FIG. 5. FIG. 7 illustrates a section taken along the line II-II' of FIG. 5.

Based on one first pixel PXL1 disposed on an ith row and a jth (where j is a natural number) column in the first display region PXA1, three first scan lines S1i−1, S1i, and S1i+1, a first light emitting control line Eli, a power line PL, and a data line Dj, which are connected to the first pixel PXL1, are illustrated in FIGS. 5 to 7. That is, in an embodiment of the present disclosure, a first control line for controlling driving of the first pixel PXL1 may include the plurality of scan lines S1i−1, S1i, and S1i+1 and the first light emitting control line E1i, which are connected to the first pixel PXL1.

Here, the first scan line S1i on the ith row on which the first pixel PXL1 is disposed may be a current scan line for supplying a scan signal to first pixels PXL1 on the ith row. In addition, the other first scan lines S1i−1 and S1i+1 connected to the first pixel PXL1 are used as initialization control lines for controlling initialization, and may be used as current scan lines in first pixels PXL1 on adjacent rows, for example, (i−1)th and (i+1)th rows. The first control lines S1i−1, S1i, S1i+1, and E1i extend along the first direction DR1 in the first display region PXA1, and may have a length corresponding to the first width W1.

In FIGS. 5 to 7, for convenience of description, a first scan line on the (i−1)th row is referred to as an "(i−1)th first scan line S1i−1," a first scan line on the ith row is referred to as an "ith first scan line S1i," a first scan line on the (i+1)th row is referred to as an "(i+1)th first scan line S1i+1," a first light emitting control line on the ith row is referred to as a "first light emitting control line E1i," a data line on the jth column is referred to as a "data line Dj," and a power line on the jth column, for example, a power line on the jth column, to which the first power source ELVDD is applied, is referred to as a "power line PL."

The embodiment of the present disclosure will be described with reference to FIGS. 5 to 7 in conjunction with FIGS. 1 to 4 described above. The display device according to the embodiment of the present disclosure may include a substrate SUB, a line unit, and pixels PXL, for example, first pixels PXL1.

The line unit supplies driving signals and/or power to each of the first pixels PXL1. In some embodiments, the line unit may include first scan lines S1$i$−1, S1$i$, and S1$i$+1, a data line Dj, a light emitting control line E1$i$, a power line PL, and an initialization power line IPL.

The first scan lines S1$i$−1, S1$i$, and S1$i$+1 may extend in the first direction DR1 in the first display region PXA1. In some embodiments, the first scan lines S1$i$−1, S1$i$, and S1$i$+1 may include an (i−1)th first scan line S1$i$−1, an ith first scan line S1$i$, and an (i+1)th first scan line S1$i$+1, which are sequentially arranged along the second direction DR2 crossing the first direction DR1. The first scan lines S1$i$−1, S1$i$, and S1$i$+1 may be applied with scan signals. For example, the (i−1)th first scan line S1$i$−1 may be applied with an (i−1)th scan signal, the ith first scan line S1$i$ may be applied with an ith first scan signal, and the (i+1)th first scan line S1$i$+1 may be applied with an (i+1)th first scan signal.

The light emitting control line E1$i$ may extend in the first direction DR1 in the first display region PXA1. The light emitting control line E1$i$ may be applied with a light emitting control signal.

The data line Dj may extend in the second direction DR2. That is, the data line Dj may extend in a direction crossing the first control lines S1$i$−1, S1$i$, S1$i$+1, and E1$i$. The data line Dj may be applied with a data signal.

The power line PL may extend along the second direction DR2; however, the present disclosure is not limited thereto. The power line PL is disposed to be space apart from the data line Dj, and may be applied with the first power source ELVDD.

The initialization power line IPL may extend along the first direction DR1; however, the present disclosure is not limited thereto. The initialization power line IPL may be applied with the initialization power source Vint.

In some embodiments, each of the first pixels PXL1 may include first to seventh transistors T1 to T7, a storage capacitor Cst, and an organic light emitting diode OLED.

The first transistor T1 may include a first gate electrode GE1, a first active pattern ACT1, a first source electrode SE1, a first drain electrode DE1, and a first connection line CNL1. The first gate electrode GE1 may be connected to a third drain electrode DE3 of the third transistor T3 and a fourth drain electrode DE4 of the fourth transistor T4. In some embodiments, the first connection line CNL1 may connect between the first gate electrode GE1 and the third and fourth drain electrodes DE3 and DE4. One end of the first connection line CNL1 may be connected to the first gate electrode GE1 through a first contact hole (e.g., a first contact opening) CH1, and the other end of the first connection line CNL1 may be connected to the third and fourth drain electrodes DE3 and DE4 through a second contact hole (e.g., a second contact opening) CH2.

In an embodiment of the present disclosure, the first active pattern ACT1, the first source electrode SE1, and the first drain electrode DE1 may be formed of a semiconductor layer undoped or doped with impurities. For example, the first source electrode SE1 and the first drain electrode DE1 may be formed of a semiconductor layer doped with impurities, and the active pattern ACT1 may be formed of a semiconductor layer undoped with impurities.

In some embodiments, the first active pattern ACT1 has a bar shape extending in a set or predetermined direction, and may have a shape in which it is bent multiple times along the extending direction. The first active pattern ACT1 may overlap with the first gate electrode GE1 when viewed from the top or plan view. As the first active pattern ACT1 is formed long, a channel region of the first transistor T1 can be formed long. Thus, the driving range of a gate voltage applied to the first transistor T1 is widened. Accordingly, the gray scale of light emitted from the light emitting diode OLED can be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5.

The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the ith first scan line S1$i$. The second gate electrode GE2 may be provided as a portion of the ith first scan line S1$i$ or may be provided in a shape protruding from the ith first scan line S1$i$.

In some embodiments, the second active pattern ACT2, the second source electrode SE2, and the second drain electrode DE2 may be formed of a semiconductor undoped or doped with impurities. For example, the second source electrode SE2 and the second drain electrode DE2 may be formed of a semiconductor doped with impurities, and the second active pattern ACT2 may be formed of a semiconductor layer undoped with impurities. The second active pattern ACT2 corresponds to a portion overlapping with the second gate electrode GE2. One end of the second source electrode SE2 may be connected to the second active pattern ACT2. The other end of the second source electrode SE2 may be connected to the data line Dj through a sixth contact hole (e.g., a sixth contact opening) CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure so as to prevent or reduce a leakage current. That is, the third transistor T3 may include a 3$ath$ transistor T3$a$ and a 3$bth$ transistor T3$b$. The 3$ath$ transistor T3$a$ may include a 3$ath$ gate electrode GE3$a$, a 3$ath$ active pattern ACT3$a$, a 3$ath$ source electrode SE3$a$, and a 3$ath$ drain electrode DE3$a$. The 3$bth$ transistor T3$b$ may include a 3$bth$ gate electrode GE3$b$, a 3$bth$ active pattern ACT3$a$, a 3$bth$ source electrode SE3$b$, and a 3$bth$ drain electrode DE3$b$. Hereinafter, the 3$ath$ gate electrode GE3$a$ and the 3$bth$ gate electrode GE3$b$ are referred to as a third gate electrode GE3, the 3$ath$ active pattern ACT3$a$ and the 3$bth$ active pattern ACT3$b$ are referred to as a third active pattern ACT3, the 3$ath$ source electrode SE3$a$ and the 3$bth$ source electrode SE3$b$ are referred to as the third source electrode SE3, and the 3$ath$ drain electrode DE3$a$ and the 3$bth$ drain electrode DE3$b$ are referred to as the third drain electrode DE3.

The third gate electrode GE3 may be connected to the ith first scan line S1$i$. The third gate electrode GE3 may be provided as a portion of the ith first scan line S1$i$ or may be provided in a shape protruding from the ith first scan line S1$i$. For example, the 3$ath$ gate electrode GE3$a$ may be provided in a shape protruding from the ith first scan line S1$i$, and the 3$b$th gate electrode GE3$b$ may be provided as a portion of the ith first scan line S1$i$.

The third active pattern ACT3, the third source electrode SE3, and the third drain electrode DE3 may be formed of a semiconductor layer undoped or doped with impurities. For example, the third source electrode SE3 and the third drain electrode DE3 may be formed of a semiconductor layer doped with impurities, and the third active pattern ACT3 may be formed of a semiconductor layer undoped with impurities. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the first connection line CNL1, the second contact hole CH2, and the first contact hole CH1.

The fourth transistor T4 may be provided in a double gate structure so as to prevent or reduce a leakage current. That is, the fourth transistor T4 may include a 4$a$th transistor T4$a$ and a 4$b$th transistor T4$b$. The 4$a$th transistor T4$a$ may include a 4$a$th gate electrode GE4$a$, a 4$a$th active pattern ACT4$a$, a 4$a$th source electrode SE4$a$, and a 4$a$th drain electrode DE4$a$, and the 4$b$th transistor T4$b$ may include a 4$b$th gate electrode GE4$b$, a 4$b$th active pattern ACT4$b$, a 4$b$th source electrode SE4$b$, and a 4$b$th drain electrode DE4$b$. Hereinafter, the 4$a$th gate electrode GE4$a$ and the 4$b$th gate electrode GE4$b$ are referred to as a fourth gate electrode GE4, the 4$a$th active pattern ACT4$a$ and the 4$b$th active pattern ACT4$b$ are referred to as a fourth active pattern ACT4, the 4$a$th source electrode SE4$a$ and the 4$b$th source electrode SE4$b$ are referred to as a fourth source electrode SE4, and the 4$a$th drain electrode DE4$a$ and the 4$b$th drain electrode DE4$b$ are referred to as the fourth drain electrode DE4.

The fourth gate electrode GE4 may be connected to the (i−1)th first scan line S1$i$−1. The fourth gate electrode GE4 may be provided as a portion of the (i−1)th first scan line S1$i$−1 or may be provided in a shape protruding from the (i−1)th first scan line S1$i$−1. For example, the 4$a$th gate electrode GE4$a$ may be provided as a portion of the (i−1)th first scan line S1$i$−1. The 4$b$th gate electrode GE4$b$ may be provided in a shape protruding from the (i−1)th first scan line S1$i$−1.

The fourth active pattern ACT4, the fourth source electrode SE4, and the fourth drain electrode DE4 may be formed of a semiconductor layer undoped or doped with impurities. For example, the fourth source electrode SE4 and the fourth drain electrode DE4 may be formed of a semiconductor layer doped with impurities, and the fourth active pattern ACT4 may be formed of a semiconductor layer undoped with impurities. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to an initialization power line IPL of a first pixel PXL1 on an (i−1)th row and a seventh drain electrode DE7 of a seventh transistor T7 of the first pixel PXL1 on the (i−1)th row. An auxiliary connection line AUX may be provided between the fourth source electrode SE4 and the initialization power line IPL. One end of the auxiliary connection line AUX may be connected to the fourth source electrode SE4 through a ninth contact hole (e.g., a ninth contact opening) CH9. The other end of the auxiliary connection line AUX may be connected to an initialization power line IPL on the (i−1)th row through an eighth contact hole (e.g., an eighth contact opening) CH8 of the first pixel PXL1 on the (i−1)th row.

One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the first connection line CNL1, the second contact hole CH2, and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the first light emitting control line E1$i$. The fifth gate electrode GE5 may be provided as a portion of the first light emitting control line E1$i$ or may be provided in a shape protruding from the first light emitting control line E1$i$.

The fifth active pattern ACT5, the fifth source electrode SE5, and the fifth drain electrode DE5 may be formed of a semiconductor layer undoped or doped with impurities. For example, the fifth source electrode SE5 and the fifth drain electrode DE5 may be formed of a semiconductor layer doped with impurities, and the fifth active pattern ACT5 may be formed of a semiconductor layer undoped with impurities. The fifth active pattern ACT5 corresponds to a portion overlapping with the fifth gate electrode GE5.

One end of the fifth source electrode SE5 may be connected to the fifth active pattern ACT5. The other end of the fifth source electrode SE5 may be connected the power line PL through a fifth contact hole (e.g., a fifth contact opening) CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be connected to the first light emitting control line E1$i$. The sixth gate electrode SE6 may be provided as a portion of the first light emitting control line E1$i$ or may be provided in a shape protruding from the first light emitting control line E1$i$.

The sixth active pattern ACT6, the sixth source electrode SE6, and the sixth drain electrode DE6 may be formed of a semiconductor layer undoped or doped with impurities. For example, the sixth source electrode SE6 and the sixth drain electrode DE6 may be formed of a semiconductor layer doped with impurities, and the sixth active pattern ACT6 may be formed of a semiconductor layer undoped with impurities. The sixth active pattern ACT6 corresponds to a portion overlapping with the sixth gate electrode GE6.

One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the (i+1)th first scan line S1$i$+1. The seventh gate electrode GE7 may be provided as a portion of the (i+1)th first scan line S1$i$+1 or may be provided in a shape protruding from the (i+1)th first scan line S1$i$+1.

The seventh active pattern ACT7, the seventh source electrode SE7, and the seventh drain electrode DE7 may be formed of a semiconductor layer undoped or doped with impurities. For example, the seventh source electrode SE7 and the seventh drain electrode DE7 may be formed of a semiconductor layer doped with impurities, and the seventh active layer ACT7 may be formed of a semiconductor layer undoped with impurities. The seventh active pattern ACT7 corresponds to a portion overlapping with the seventh gate electrode GE7.

One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL.

The storage capacitor Cst may include a lower electrode LE and an upper electrode UE. The lower electrode LE may be formed as the first gate electrode GE1 of the first transistor T1. The upper electrode UE overlaps with the first gate electrode GE1, and may cover the lower electrode LE when viewed from the top or plan view. As the overlapping area of the upper electrode UE and the lower electrode LE is widened, the capacitance of the storage capacitor Cst may be increased.

In some embodiments, the upper electrode UE may extend in the first direction DR1. A voltage having the same or substantially the same level as the first power source may be applied to the upper electrode UE. The upper electrode UE may have an opening OPN in a region including the first contact hole CH1 through which the first gate electrode GE1 and the first connection line CNL1 are in contact with each other.

The organic light emitting device OLED may include a first electrode AD, a second electrode CD, and an emitting layer EML provided between the first electrode AD and the second electrode CD.

The first electrode AD may be provided in a light emitting region corresponding to each pixel PXL1. The first electrode AD may be connected to the seventh source electrode SE7 of the seventh transistor T7 and the sixth drain electrode DE6 of the sixth transistor T6 through a seventh contact hole (e.g., a seventh contact opening) CH7 and a tenth contact hole (e.g., a tenth contact opening) CH10. A bridge pattern BRP may be provided between the seventh contact hole CH7 and the tenth contact hole CH10. The bridge pattern BRP1 may connect the first electrode AD to the sixth drain electrode DE6 and the seventh source electrode SE7.

Hereinafter, a structure of the display device according to the embodiment of the present disclosure will be described along a stacking order with reference to FIGS. 5 to 7.

First, an active pattern layer may be disposed on the substrate SUB. In some embodiments, the active patterns ACT1 to ACT7 (hereinafter, referred to as "ACT") may be provided in the active pattern layer. In some embodiments, the active patterns ACT may include the first to seventh active patterns ACT1 to ACT7. The first to seventh active patterns ACT1 to ACT7 may be formed of a semiconductor material. In some embodiments, a buffer layer may be provided between the substrate SUB and the first to seventh active patterns ACT1 to ACT7.

A first insulating layer GI may be provided on the substrate SUB on which the first to seventh active patterns ACT1 to ACT7 are provided. In some embodiments, the first insulating layer GI may be a gate insulating layer interposed between the active patterns ACT1 to ACT7 and the gate electrodes GE1 to GE7 of the transistors T1 to T7 provided in the pixels PXL. In some embodiments, the first gate insulating layer GI may include one or more inorganic layers and/or one or more organic layers. For example, the first insulating layer GI may be configured as an inorganic layer including $SiO_x$, $SiN_x$, and/or the like; however, the present disclosure is not limited thereto. For example, the first insulating layer GI may include an inorganic insulating material or organic insulating material such as $SiO_x$, $SiN_x$, SiON, SiOF, $AlO_x$, and/or the like. The first insulating layer GI may be a single layer or multi-layer including at least one of these materials.

In an embodiment of the present disclosure, the first insulating layer GI may have a thickness limited to a set or predetermined range so as to easily drive the transistors T1 to T7. For example, the first insulating layer GI may have a thickness of 1000 Å to 1500 Å, for example, a thickness of about 1200 Å; however, the thickness of the first insulating layer GI is not limited thereto. In some embodiments, the first insulating layer GI may be commonly formed in a plurality of display regions, for example, the first to third display regions PXA1, PXA2, and PXA3; however, the present disclosure is not limited thereto.

A first conductive layer, for example, a first gate layer may be disposed on the first insulating layer GI. In some embodiments, the first control lines S1$i$−1, S1$i$, S1$i$+1, and E1$i$ and the gate electrodes GE1 to GE7 may be provided in the first conductive layer. In some embodiments, one electrode, for example, the lower electrode LE of the storage capacitor Cst may be provided in the first conductive layer. For example, the (i−1)th first scan line S1$i$−1, the ith first scan line S1$i$, the (i+1)th first scan line S1$i$+1, the light emitting control line E1$i$, and the first to seventh gate electrodes GE1 to GE7 may be provided in the first conductive layer on the first insulating layer GI. In some embodiments, the first gate electrode GE1 may become the lower electrode LE of the storage capacitor Cst. That is, in some embodiments, the first gate electrode GE1 and the lower electrode LE of the storage capacitor Cst may be integrally formed. In some embodiments, the second gate electrode GE2 and the third gate electrode GE3 may be integrally formed with the ith first scan line S1$i$. In some embodiments, the fourth gate electrode GE4 may be integrally formed with the (i−1)th first scan line S1$i$−1. In some embodiments, the fifth gate electrode GE5 and the sixth gate electrode GE6 may be integrally formed with the light emitting control line E1$i$. In some embodiments, the seventh gate electrode GE7 may be integrally formed with the (i+1)th first scan line S1$i$+1.

In some embodiments, the first control lines S1$i$−1, S1$i$, S1$i$+1, and E1$i$, the gate electrodes GE1 to GE7, and/or the lower electrode LE of the storage capacitor Cst, which are disposed in the first conductive layer, may be formed of the same or substantially the same material. For example, the first control lines S1$i$−1, S1$i$, S1$i$+1, and E1$i$, the gate electrodes GE1 to GE7, and/or the lower electrode LE of the storage capacitor Cst may be formed of a first gate metal (e.g., a predetermined first gate metal).

In some embodiments, examples of the metal capable of constituting the first gate metal, may be Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, and the like, and may include various suitable metals as well as the above-described metals. Examples of the alloy capable of constituting the first gate metal may be MoTi, AlNiLa, and the like, and may include various suitable alloys as well as the above-described alloys. Examples of the multi-layer capable of constituting the first gate metal may be Ti/Cu, Ti/Au, Mo/Al/Mo, ITO/Ag/ITO, TiN/Ti/Al/Ti, TiN/Ti/Cu/Ti, and the like, and may include various suitable conductive materials having multi-layered structures as well as the above-described multi-layers.

The material constituting the first control lines S1$i$−1, S1$i$, S1$i$+1, and E1$i$, the gate electrodes GE1 to GE7, and/or the lower electrode LE of the storage capacitor Cst, which are disposed in the first conductive layer, is not necessarily limited to the metal. That is, any material capable of providing conductivity to a degree (e.g., to a sufficiently low degree) to which the first pixels PXL1 can be smoothly driven may be used as the material constituting the first control lines S1$i$−1, S1$i$, S1$i$+1, and E1$i$, the gate electrodes GE1 to GE7, and/or the lower electrode LE of the storage capacitor Cst.

For example, the first control lines S1$i$−1, S1$i$, S1$i$+1, and E1$i$, the gate electrodes GE1 to GE7, and/or the lower electrode LE of the storage capacitor Cst may be formed of a conductive polymer or conductive metal oxide. Examples of the conductive polymer capable of constituting the first control lines S1$i$−1, S1$i$, S1$i$+1, and E1$i$, the gate electrodes GE1 to GE7, and/or the lower electrode LE of the storage capacitor Cst may be polythiophene-based, polypyrrole-based, polyaniline-based, polyacetylene-based, and polyphenylene-based compounds, mixtures thereof, and the like, and particularly, may include a PEDOT/PSS compound among the polythiophene-based compounds. Examples of the conductive metal oxide capable of constituting the first control lines S1$i$−1, S1$i$, S1$i$+1, and E1$i$, the gate electrodes GE1 to GE7, and/or the lower electrode LE of the storage capacitor Cst may be ITO, IZO, AZO, ITZO, ZnO, SnO$_2$, and/or the like.

A second insulating layer IL1 may be provided on the first conductive layer. In some embodiments, the second insulating layer IL1 may be a first interlayer insulating layer interposed between the lower electrode LE and the upper electrode UE of the storage capacitor Cst. In some embodiments, the second insulating layer IL1 may have a thickness limited to a set or predetermined range so as to sufficiently secure the capacity of the storage capacitor Cst within a limited area. In some embodiments, the second insulating layer IL1 may have a thickness to a similar degree to the first insulating layer GI. For example, the second insulating layer IL1 may have a thickness of 1000 Å to 1500 Å, for example, a thickness of about 1400 Å; however, the thickness of the second insulating layer IL1 is not limited thereto. In some embodiments, the second insulating layer IL1 may be commonly formed in a plurality of display regions, for example, the first to third display regions PXA1, PXA2, and PXA3; however, the present disclosure is not limited thereto.

In some embodiments, the second insulating layer IL1 may include one or more inorganic layers and/or one or more organic layers. For example, the second insulating layer IL1 may be configured as an inorganic layer including SiO$_x$, SiN$_x$, and/or the like; however, the present disclosure is not limited thereto. For example, the second insulating layer IL1 may include an inorganic insulating material or organic insulating material such as SiO$_x$, SiN$_x$, SiON, SiOF, AlO$_x$, and/or the like. The second insulating layer IL1 may be a single layer or multi-layer including at least one of these materials.

A second conductive layer, for example, a second gate layer may be disposed on the second insulating layer IL1. In some embodiments, the upper electrode UE of the storage capacitor Cst and the initialization power line IPL may be provided in the second conductive layer. In some embodiments, the upper electrode UE may cover the lower electrode LE. As the upper electrode UE overlaps with the lower electrode LE with the second insulating layer IL1 interposed therebetween, the upper electrode UE along with the lower electrode LE can constitute the storage capacitor Cst.

In some embodiments, the upper electrode UE of the storage capacitor Cst and the initialization power line IPL, which are disposed in the second conductive layer, may be formed of the same or substantially the same material. For example, the upper electrode UE of the storage capacitor Cst and the initialization power line IPL may be formed of a second gate metal (e.g., a predetermined second gate metal). In some embodiments, the second gate metal may be one of the metals proposed as examples of the first gate metal described above; however, the present disclosure is not limited thereto. In addition, the material constituting the upper electrode UE of the storage capacitor Cst and the initialization power line IPL, which are disposed in the second conductive layer, is not necessarily limited to the metal. That is, any material capable of providing conductivity to a degree (e.g., to a sufficiently low degree) to which the first pixels PXL1 can be smoothly driven may be used as the material constituting the upper electrode UE of the storage capacitor Cst and the initialization power line IPL. For example, the upper electrode UE of the storage capacitor Cst and the initialization power line IPL may be formed of a conductive polymer or conductive metal oxide.

A third insulating layer IL2 may be provided on the second conductive layer. In some embodiments, the third insulating layer IL2 may be a second interlayer insulating layer. In some embodiments, the third insulating layer IL2 may have a greater thickness than the first insulating layer GI and the second insulating layer IL1. For example, the third insulating layer IL2 may have a thickness equal to or greater than the sum of the thickness of the first insulating layer GI and the thickness of the second insulating layer IL1. For example, the third insulating layer IL2 may have a thickness of about 5000 Å; however, the thickness of the third insulating layer IL2 is not limited thereto. If the third insulating layer IL2 is formed to have a sufficient thickness greater than the sum of the thickness of the first insulating layer GI and the thickness of the second insulating layer IL1, it is possible to ensure electrical stability between components disposed on the bottom and top of the third insulating layer IL2. Accordingly, a short circuit can be effectively prevented or instances thereof may be substantially reduced. In some embodiments, the third insulating layer IL2 may be commonly formed in a plurality of display regions, for example, the first to third display regions PXA1, PXA2, and PXA3; however, the present disclosure is not limited thereto.

In some embodiments, the third insulating layer IL2 may include one or more inorganic layers and/or one or more organic layers. For example, the third insulating layer IL2 may be configured as an inorganic layer including SiO$_x$, SiN$_x$, and/or the like; however, the present disclosure is not limited thereto. For example, the second insulating layer IL1 may include an inorganic insulating material or organic insulating material such as $SiO_x$, $SiN_x$, SiON, SiOF, $AlO_x$, and/or the like. The second insulating layer IL1 may be a single layer or multi-layer including at least one of these materials.

A third conductive layer, for example, a source-drain layer may be disposed on the third insulating layer IL2. In some embodiments, the data line Dj, the power line PL, the first connection line CNL1, the auxiliary connection line AUX, and the bridge pattern BRP may be provided in the third conductive layer.

In some embodiments, the data line Dj may be connected to the second source electrode SE2 through the sixth contact hole CH6 passing through the first insulating layer GI, the second insulating layer IL1, and the third insulating layer IL2.

In some embodiments, the power line PL may be connected to the upper electrode UE of the storage capacitor Cst through the third and fourth contact holes CH3 and CH4 passing through the third insulating layer IL2. Also, the power line PL may be connected to the fifth source electrode SE5 through the fifth contact hole CH5 passing through the first insulating layer GI, the second insulating layer IL1, and the third insulating layer IL2.

In some embodiments, the first connection line CNL1 may be connected to the first gate electrode GE1 through the first contact hole CH1 passing through the second insulating layer IL1 and the third insulating layer IL2. Also, the first connection line CNL1 may be connected to the third drain electrode DE3 and the fourth drain electrode DE4 through the second contact hole CH2 passing through the first insulating layer GI, the second insulating layer IL1, and the third insulating layer IL2.

In some embodiments, the auxiliary connection line AUX may be connected to the initialization power line IPL through the eighth contact hole CH8 passing through the third insulating layer IL2. Also, the auxiliary connection line AUX may be connected to the seventh drain electrode DE7 through the ninth contact hole CH9 passing through the first insulating layer GI, the second insulating layer IL1, and the third insulating layer IL2.

In some embodiments, the bridge pattern BRP may be a pattern provided as a medium connecting the sixth drain electrode DE6 and the first electrode AD between the sixth drain electrode DE6 and the first electrode AD. The bridge pattern BRP may be connected to the sixth drain electrode DE6 and the seventh source electrode SE7 through the seventh contact hole CH7 passing through the first insulating layer GI, the second insulating layer IL1, and the third insulating layer IL2.

In some embodiments, the data line Dj, the power line PL, the first connection line CNL1, the auxiliary connection line AUX, and/or the bridge pattern BRP, which are disposed in the third conductive layer, may be formed of the same or substantially the same material. For example, the data line Dj, the power line PL, the first connection line CNL1, the auxiliary connection line AUX, and/or the bridge pattern BRP may be formed of a source-drain metal (e.g., a predetermined source-drain metal).

In some embodiments, the source-drain metal may be one of the metals proposed as examples of the first gate metal and/or the second gate metal, described above; however, the present disclosure is not limited thereto. In addition, the material constituting the data line Dj, the power line PL, the first connection line CNL1, the auxiliary connection line AUX, and/or the bridge pattern BRP, which are disposed in the third conductive layer, is not necessarily limited to the metal. That is, any material capable of providing conductivity to a degree (e.g., to a sufficiently low degree) to which the first pixels PXL1 can be smoothly driven may be used as the material constituting the data line Dj, the power line PL, the first connection line CNL1, the auxiliary connection line AUX, and/or the bridge pattern BRP. For example, the data line Dj, the power line PL, the first connection line CNL1, the auxiliary connection line AUX, and/or the bridge pattern BRP may be formed of a conductive polymer or conductive metal oxide.

In some embodiments, at least two of the first gate metal, the second gate metal, and the source-drain metal may be made of the same or substantially the same material. For example, although the first gate metal and the second gate metal are disposed in layers different from each other, the first gate metal and the second gate metal may be made of the same or substantially the same material. However, the present disclosure is not limited thereto. For example, in another embodiment, all of the first gate metal, the second gate metal, and the source-drain metal may be made of different materials.

A fourth insulating layer PSV may be provided on the third conductive layer. In some embodiments, the fourth insulating layer PSV may include a passivation layer and/or a planarization layer.

The organic light emitting diode OLED may be provided on the fourth insulating layer PSV. The organic light emitting diode OLED may include the first electrode AD, the second electrode CD, and the emitting layer EML provided between the first and second electrodes AD and CD.

In some embodiments, the first electrode AD may be provided on the fourth insulating layer PSV. The first electrode AD may be connected to the bridge pattern BRP through the tenth contact hole CH10 passing through the fourth insulating layer PSV. Because the bridge pattern BRP is connected to the sixth drain electrode DE6 and the seventh source electrode SE7 through the seventh contact hole CH7, the first electrode AD can be finally connected to the sixth drain electrode DE6 and the seventh source electrode SE7.

In some embodiments, a pixel defining layer PDL defining a light emitting region to correspond to each pixel PXL may be provided on the substrate SUB on which the first electrode AD and the like are disposed. The pixel defining layer PDL exposes a top surface of the first electrode AD, and may protrude from the substrate SUB along the circumference of the pixel PXL.

The emitting layer EML may be provided in the light emitting region surrounded by the pixel defining layer PDL, and the second electrode CD may be provided on the emitting layer EML. In some embodiments, an encapsulation layer SLM covering the second electrode CD may be provided over the second electrode CD.

In some embodiments, one of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

At least one of the first electrode AD and the second electrode CD may be a transmissive electrode. For example, when the light emitting diode OLED is a bottom-emission organic light emitting diode, the first electrode AD may be a transmissive electrode, and the second electrode CD is a reflective electrode. When the light emitting diode OLED is a top-emission organic light emitting diode, the first electrode AD may be a reflective electrode, and the second electrode CD may be a transmissive electrode. When the light emitting diode OLED is a dual-emission light emitting diode, both of the first electrode AD and the second electrode CD may be transmissive electrodes. In this embodiment, a case where the light emitting diode OLED is a top-emission organic light emitting diode, and the first electrode AD is an anode electrode has been described as an example. Also, in this embodiment, the organic light emitting diode OLED has been used as a light source; however, the present disclosure is not limited thereto. For example, the organic light emitting diode OLED may be replaced by another type of light emitting diode.

In some embodiments, the first electrode AD may include a reflective layer capable of reflecting light and a transparent conductive layer disposed on the top or bottom of the reflective layer. At least one of the transparent conductive layer and the reflective layer may be connected to the sixth drain electrode DE6 and the seventh source electrode SE7.

In some embodiments, the reflective layer may include a material capable of reflecting light. For example, the reflective layer may include aluminum (Al), silver (Ag), chromium (Cr), molybdenum (Mo), platinum (Pt), nickel (Ni), and/or the like, and any alloy thereof.

In some embodiments, the transparent conductive layer may include a transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

In some embodiments, the pixel defining layer PDL may include an organic insulating material. For example, the pixel defining layer PDL may include polystyrene, polymethylmethacrylate (PMMA), polyacrylonitrile (PAN), polyimide (PA), polyimide (PI), polyarylether (PAE), heterocyclic polymer, parylene, epoxy, benzocyclobutene (BCB), siloxane based resin, silane based resin, and/or the like.

The emitting layer EML may be disposed on the exposed surface of the first electrode AD. The emitting layer EML may have a multi-layered thin film structure at least including a light generation layer (LGL). For example, the emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron transport layer (EIL) for injecting electrons.

In some embodiments, the color of light generated in the LGL may be one of red, green, blue, and white; however, the present disclosure is not limited thereto. For example, the color of light generated in the LGL of the light emitting layer EML may also be one of magenta, cyan, and yellow.

In some embodiments, the HIL, HTL, HBL, ETL, and EIL may be common layers connected to adjacent light emitting regions.

In some embodiments, the second electrode CD may be a semi-transmissive reflective layer. For example, the second electrode CD may be a thin metal layer having a thickness, through which light emitted through the emitting layer EML can be transmitted. The second electrode CD may transmit a portion of the light emitted from the emitting layer EML therethrough, and reflect the rest of the light emitted from the emitting layer EML.

In some embodiments, the second electrode CD may include a material having a lower work function than the transparent conductive layer. For example, the second electrode CD may be include molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or the like, and any alloy thereof.

A portion of the light emitted from the emitting layer EML may not be transmitted through the second electrode CD, and the light reflected from the second electrode CD may be again reflected from the reflective layer. That is, the light emitted from the emitting layer EML may resonate between the reflective layer and the second electrode CD. The light extraction efficiency of the organic light emitting diodes OLED can be improved (e.g., increased) by the resonance of the light.

In some embodiments, the encapsulation layer SLM may prevent or substantially prevent oxygen and moisture from penetrating into the light emitting diode OLED. To this end, the encapsulation layer SLM may include an inorganic layer. The inorganic layer may include silicon oxide, silicon nitride, silicon oxynitride, aluminum oxide, titanium oxide, zirconium oxide, tin oxide, and/or the like. The encapsulation layer SLM covers at least the display regions PXA, and may extend up to the outside of the display regions PXA.

In an embodiment of the present disclosure, the second pixel PXL2 provided in the second display region PXA2 and the third pixel PXL3 provided in the third display region PXA3 have the substantially same pixel structure as the first pixel PXL1, and therefore, their descriptions may not be repeated.

Figure 8:
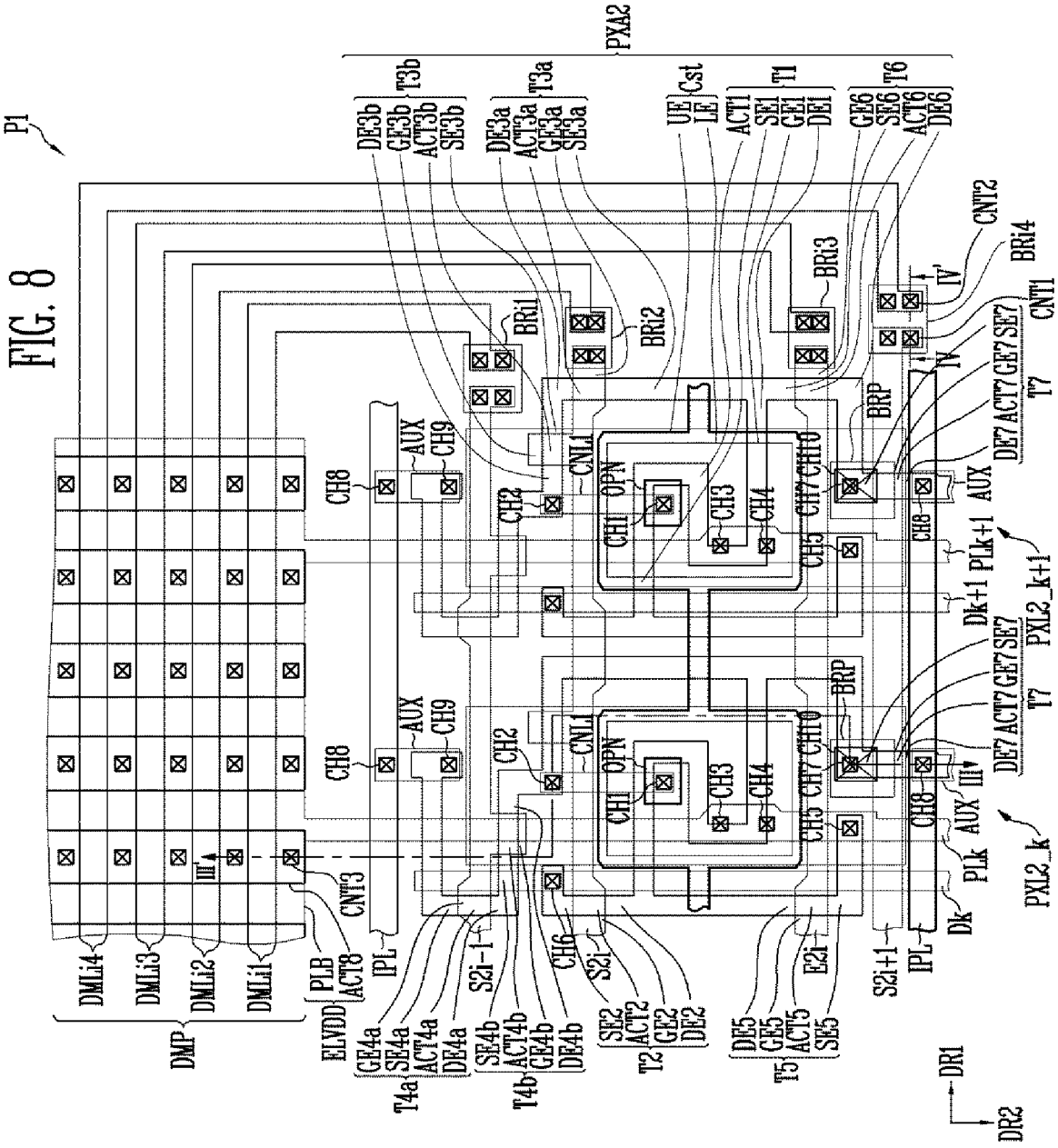
FIG. 8 illustrates a detailed structure of an embodiment of second pixels and a dummy region corresponding to the region P1 shown in FIG. 1.
Figure 9:
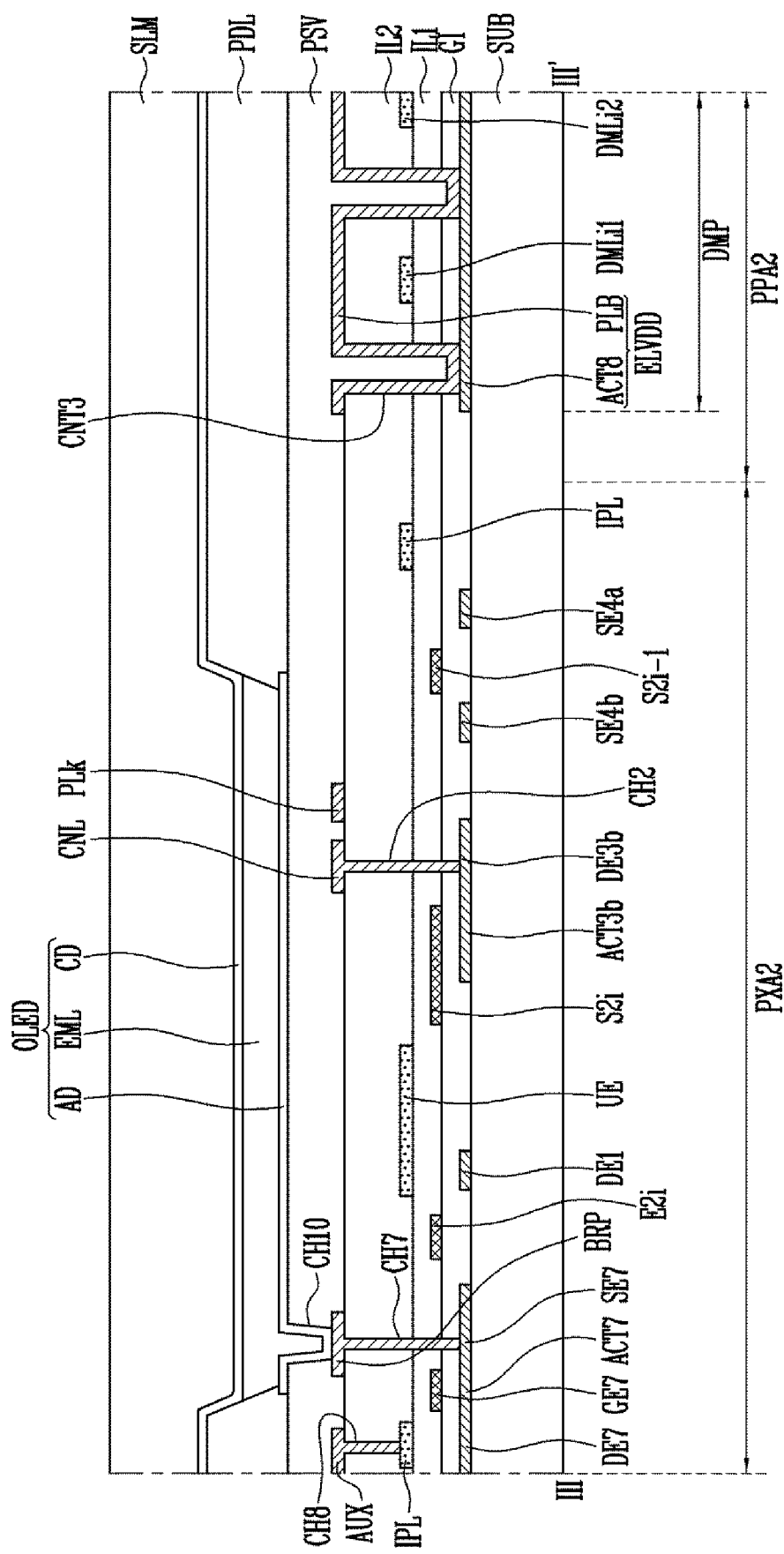
FIG. 9 illustrates a section taken along the line III-III' of FIG. 8.
Figure 10:
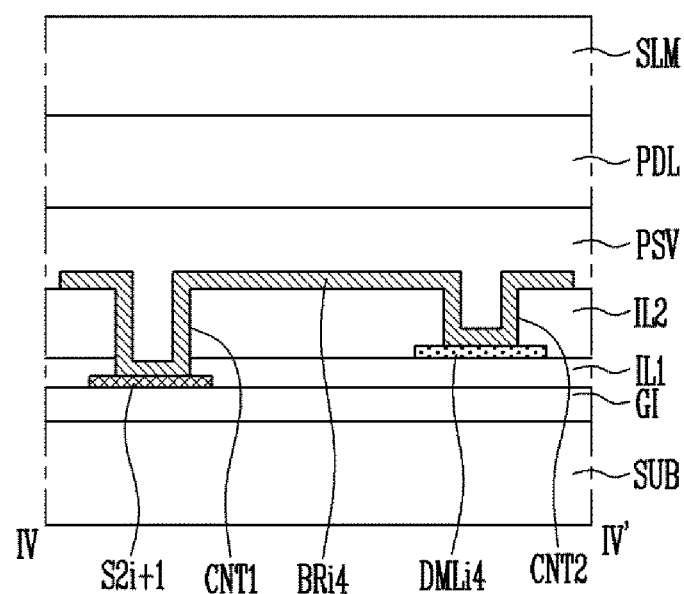
FIG. 10 illustrates a section taken along the line IV-IV' of FIG. 8.

FIG. 8 illustrates an embodiment of a detailed structure of second pixels and a dummy region corresponding to the region P1 shown in FIG. 1. FIG. 9 illustrates a section taken along the line III-III' of FIG. 8. FIG. 10 illustrates a section taken along the line IV-IV' of FIG. 8. In FIGS. 8 to 10, components similar to or identical to those shown in FIGS. 5 to 7 are designated by like reference numerals, and their detailed descriptions may not be repeated.

Based on one second pixel PXL2_$k$ disposed on an ith row and kth (k is a natural number) column of the second display region PXA2 and one second pixel PXL2_$k$+1 disposed on the ith row and a (k+1)th column of the second display region PXA2, three second scan lines S2$i$−1, S2$i$, and S2$i$+1, one second light emitting control line E2$i$, and two second data lines Dk and Dk+1, which are connected to the two second pixels PXL2_$k$ and PXL2_$k$+1, are illustrated in FIGS. 8 to 10. In addition, the two second pixels PXL2_$k$ and PXL2_$k$+1 disposed adjacent to the dummy region DMP are illustrated in FIG. 8, however, the other second pixels PXL2 may also have the substantially same structure.

In an embodiment of the present disclosure, a second control line for controlling driving of each of the second pixels PXL2 may include a plurality of second scan lines S2$i$−1, S2$i$, and S2$i$+1 and a second light emitting control line E2$i$, which are connected to the second pixels PXL2. Here, the second scan line S2$i$ on the ith row on the second pixels PXL2 are disposed may be a current scan line for supplying a scan signal to the second pixels PXL2 on the ith row. In addition, the other scan lines S2$i$−1 and S2$i$+1 connected to the second pixels PXL2 are used as initialization control lines for controlling initialization, and may be used as current scan lines in the second pixels PXL2 on adjacent rows, for example, an (i−1)th row and an (i+1)th row. The second scan lines S2i−1, S2i, and S2i+1 extend along the first direction DR1 in the second display region PXA2, and may have a length corresponding to the second width W2.

In FIGS. 8 to 10, a second scan line on the (i−1)th row is referred to as an "(i−1)th second scan line S2i−1," a second scan line on the ith row is referred to as an "ith second scan line S2i," a second scan line on the (i+1)th row is referred to as an "(i+1)th second scan line S2i+1," a second light emitting control line on the ith row is referred to as a "light emitting control line E2i," a data line on the kth column is referred to as a "kth data line Dk," a data line on the (k+1)th column is referred to as a "(k+1)th data line Dk+1," a power line on the kth column is referred to as a "kth power line PLk," and a power line on the (k+1)th column is referred to as a "(k+1)th power line PLk+1."

Referring to FIGS. 8 to 10 in conjunction with FIG. 1, in the display device according to the embodiment of the present disclosure, structures having different parasitic capacitances for the respective display regions may be applied using the dummy region DMP so as to compensate for a difference between load values according to the display regions PXA. For example, the dummy region DMP may be provided in the first peripheral region PPA1 corresponding to the first display region PXA1 so as to compensate for a difference between load values of control lines (scan lines and/or light emitting control lines) in the first display region PXA1 and the second and third display regions PXA2 and PXA3. In addition, a dummy region DMP in which dummy lines DMLi1 to DMLi4 (hereinafter, referred to as "DML") respectively connected to the second pixels PXL2 and the third pixels PXL3 may be located in the second peripheral region PPA2 corresponding to the second display region PXA2 and the third peripheral region PPA3 corresponding to the third display region PXA3. Although not shown in these figures, the dummy region DMP may also be provided to the additional peripheral region APA. The dummy region DMP may be disposed adjacent to display regions connected thereto, for example, the second and third display regions PXA2 and PXA3; however, the position of the dummy region DMP is not limited thereto.

The display device according to the embodiment of the present disclosure may include the substrate SUB, the line unit, and pixels PXL, for example, second pixels PXL2_k and PXL2_k+1 (hereinafter, referred to as "PXL2").

The line unit supplies driving signals and/or driving power to each of the second pixels PXL2. In some embodiments, the line unit may include second scan lines S2i−1, S2i, and S2i+1, data lines Dk and Dk+1, a light emitting control line E2i, power lines PLk and PLk+1, and an initialization power line IPL.

The second scan lines S2i−1, S2i, and S2i+1 are provided in a second display region PXA2, and may extend in the first direction DR1 in the second display region PXA2. In some embodiments, the second scan lines S2i−1, S2i, and S2i+1 may be disposed in the substantially same layer as the above-described first scan lines S1i-1, S1i, and S1i+1. For example, the second scan lines S2i−1, S2i, and S2i+1 may be disposed in the first conductive layer (first gate layer) on the first insulating layer GI provided on the substrate SUB.

In some embodiments, the second scan lines S2i−1, S2i, and S2i+1 may include an (i−1)th second scan line S2i−1, an ith second scan line S2i, and an (i+1)th second scan line S2i+1, which are sequentially arranged in the second direction DR2 crossing the first direction DR1. The second scan lines S2i−1, S2i, and S2i+1 may be applied with scan signals. For example, the (i−1)th second scan line S2i−1 may be applied with an (i−1)th second scan signal, the ith second scan line S2i may be applied with an ith second scan signal, and the (i+1)th second scan line S2i+1 may be applied with an (i+1)th second scan signal.

Here, the second scan lines S2i−1, S2i, and S2i+1 may have a length different from that of the first scan lines S11 to S1n provided in the first display region PXA1. That is, because the second display region PXA2 has a shorter width than the first display region PXA1, the second scan lines S2i−1, S2i, and S2i+1 extending along the width direction (i.e., the first direction DR1) in the second display region PXA2 may have a shorter length than the first scan lines S11 to S1n extending along the width direction (i.e., the first direction DR1) in the first display region PXA1.

The light emitting control line E2i may extend in the first direction DR1 in the second display region PXA2. The light emitting control line E2i may be applied with a light emitting control signal. In some embodiments, the light emitting control line E2i provided in the second display region PXA2 may be disposed in the substantially same layer as the above-described light emitting control line E1i provided in the first display area PXA1. For example, the light emitting control line E2i provided in the second display region PXA2 may be disposed in the first conductive layer (first gate layer) on the first insulating layer GI provided on the substrate SUB.

In some embodiments, the second pixels PXL2_k and PXL2_k+1 may have the substantially same structure as the above-described first pixels PXL1. For example, each of the second pixels PXL2_k and PXL2_k+1 may include at least one transistor, for example, first to seventh transistors T1 to T7, a storage capacitor Cst, and an organic light emitting diode OLED, which are connected to a set or predetermined second control line.

In some embodiments, like the first to seventh transistors T1 to T7 of the above-described first pixel PXL1, the first to seventh transistors T1 to T7 of the second pixels PXL2_k and PXL2_k+1 may include active patterns ACT1 to ACT7 located in the active pattern layer provided between the substrate SUB and the first insulating layer GI, source and drain electrodes SE1 to SE7 and DE1 to DE7 connected thereto, and gate electrode GE1 to GE7 located to overlap with the corresponding active patterns ACT1 to ACT7 on the first conductive layer (first gate layer) provided on the first insulating layer GI. In some embodiments, at least some of the first to seventh transistors T1 to T7, for example, the gate electrodes GE2 to GE7 of the second to seventh transistors T2 to T7 may be connected to the set or predetermined second control line. For example, the second to seventh gate electrodes GE2 to GE7 may be integrally formed with the set or predetermined second control line.

In some embodiments, the storage capacitor Cst may include a lower electrode LE located in the first conductive layer together with the gate electrode GE1 to GE7 and the second control lines, and an upper electrode UE located in the second conductive layer (second gate layer) provided on the second insulating layer IL1.

In some embodiments, the second control lines S2i−1, S2i, S2i+1, and E2i, the gate electrodes GE1 to GE7, and/or the lower electrode LE of the storage capacitor Cst, which are disposed in the first conductive layer, may be formed of the same or substantially the same material. For example, the second control lines S2i−1, S2i, S2i+1, and E2i, the gate electrodes GE1 to GE7, and/or the lower electrode LE of the storage capacitor Cst may be formed of a first gate metal (e.g., a predetermined first gate metal). In some embodiments, the first gate metal may include at least one of the materials mentioned as the first gate metal in the description of FIGS. 5 to 7; however, the present disclosure is not limited thereto. In addition, the material constituting the second control lines S2$i$−1, S2$i$, S2$i$+1, and E2$i$, the gate electrodes GE1 to GE7, and/or the lower electrode LE of the storage capacitor Cst, which are disposed in the first conductive layer, is not necessarily limited to the metal. That is, any material capable of providing conductivity to a degree (e.g., to a sufficiently low degree) to which the second pixels PXL2 can be smoothly driven, including a conductive polymer, a conductive metal oxide, or the like, may be used as the material constituting the second control lines S2$i$−1, S2$i$, S2$i$+1, and E2$i$, the gate electrodes GE1 to GE7, and/or the lower electrode LE of the storage capacitor Cst.

In some embodiments, the upper electrode UE of the storage capacitor Cst and the initialization power line IPL, which are disposed in the second conductive layer, may be formed of the same or substantially the same material. For example, the upper electrode UE of the storage capacitor Cst and the initialization power line IPL may be formed of a second gate metal (e.g., a predetermined second gate metal). In some embodiments, the second gate metal may be the same or substantially the same as the first gate metal; however, the present disclosure is not limited thereto. That is, the second gate metal may be the same as or different from the first gate metal. In some embodiments, the second gate metal may include at least one of the materials mentioned as the second gate metal in the description of FIGS. 5 to 7; however, the present disclosure is not limited thereto. In addition, the material constituting the upper electrode UE of the storage capacitor Cst and the initialization power line IPL, which are disposed in the second conductive layer, is not necessarily limited to the metal. That is, any material capable of providing conductivity to a degree (e.g., to a sufficiently low degree) to which the second pixels PXL2 can be smoothly driven, including a conductive polymer, a conductive metal oxide, and/or the like, may be used as the material constituting the upper electrode UE of the storage capacitor Cst and the initialization power line IPL.

Additionally, in some embodiments, the data lines Dk and Dk+1, the power lines PLk and PLk+1, and the like, which are disposed in the third conductive layer, may be formed of the same or substantially the same material. For example, the data lines Dk and Dk+1, the power lines PLk and PLk+1, and the like may be formed of a source-drain metal (e.g., a predetermined source-drain metal). In some embodiments, the source-drain metal may include at least one of the materials mentioned as the source-drain metal in the description of FIGS. 5 to 7; however, the present disclosure is not limited thereto. In addition, the material constituting the data lines Dk and Dk+1, the power lines PLk and PLk+1, and the like, which are disposed in the third conductive layer, is not necessarily limited to the metal. That is, any material capable of providing conductivity to a degree to which the second pixels PXL2 can be smoothly driven, including a conductive polymer, a conductive metal oxide, and/or the like, may be used as the material constituting the data lines Dk and Dk+1, the power lines PLk and PLk+1, and the like.

Each of the second pixels PXL2_$k$ and PXL2_$k$+1 may have the substantially same structure as the first pixel PXL described in FIGS. 4 to 7. Therefore, a description related to a detailed configuration of the transistors T1 to T7, the storage capacitor Cst, and/or the organic light emitting diode OLED, which are configured in the second pixels PXL2_$k$ and PXL2_$k$+1 or a connection relationship therebetween may not be provided.

In an embodiment of the present disclosure, each of the second control lines, that is, the second scan lines S2$i$−1, S2$i$, and S2$i$+1 and the light emitting control line E2$i$ may be connected to at least one dummy line DML disposed in the dummy region DMP. For example, each of the second scan lines S2$i$−1, S2$i$, and S2$i$+1 and the light emitting control line E2$i$ may be connected to any one dummy line DML extending the second peripheral region PPA2 and/or the additional peripheral region APA to be provided in the dummy region DMP.

In some embodiments, the second control lines S2$i$−1, S2$i$, S2$i$+1, and E2$i$ to which different signals are applied at different times may be connected to different dummy lines DML. For example, when different signals are applied to four second control lines connected to the second pixel PXL2_$k$ disposed on the ith row and the kth column of the second display region PXA2, that is, second scan lines S2$i$−1, S2$i$, and S2$i$+1 and a light emitting control line E2$i$, which are disposed on the ith row, the second scan lines S2$i$−1, S2$i$, and S2$i$+1 and the light emitting control line E2$i$ may be connected to different dummy lines.

For example, the (i−1)th second scan line S2$i$−1 may be connected to a first dummy line DMLi1 provided in the dummy region DMP, and the ith second scan line S2$i$ may be connected to a second dummy line DMLi2 provided in the dummy region DMP. In addition, the light emitting control line E2$i$ may be connected to a third dummy line DMLi3 provided in the dummy region DMP, and the (i+1)th second scan line S2$i$+1 may be connected to a fourth dummy line DMLi4 provided in the dummy region DMP. In some embodiments, at least some of the second scan lines S2$i$−1, S2$i$, and S2$i$+1 and the light emitting control line E2$i$ may extend to the second peripheral region PPA2 and/or the additional peripheral region APA.

The dummy region DMP includes dummy lines DMLi1, DMLi2, DMLi3, and DMLi4 respectively connected to the second control lines S2$i$−1, S2$i$, S2$i$+1, and E2$i$, and a first power supply line ELVDD overlapping with the dummy lines DMLi1, DMLi2, DMLi3, and DMLi4. That is, the dummy region DMP may include a plurality of dummy lines DMLi1, DMLi2, DMLi3, and DMLi4 corresponding to each of the second control lines S2$i$−1, S2$i$, S2$i$+1, and E2$i$.

For example, a first dummy line DMLi1 connected to the (i−1)th second scan line S2$i$−1 to extend up to the dummy region DMP, a second dummy line DMLi2 connected to the ith second scan line S2$i$ to extend up to the dummy region DMP, a third dummy line DMLi3 connected to the light emitting control line E2$i$ to extend up to the dummy region DMP, and a fourth dummy line DMLi4 connected to the (i+1)th second scan line S2$i$+1 to extend up to the dummy region DMP may be provided in the dummy region DMP. In this manner, a plurality of dummy lines DML corresponding to the second control lines S2$i$−1, S2$i$, S2$i$+1, and E2$i$ disposed on each row of the second display region PXA2 may be provided in the dummy region DMP.

In some embodiments, the dummy lines DML, as shown in FIG. 9, may be disposed in the second conductive layer (second gate layer) provided on the second insulating layer IL1. That is, in some embodiments, the dummy lines DML may be disposed in a different conductive layer from the second control lines S2$i$−1, S2$i$, S2$i$+1, and E2$i$. For example, the second control lines S2$i$−1, S2$i$, S2$i$+1, and E2$i$ may be disposed in the first conductive layer (first gate layer) together with the gate electrodes GE1 to GE7 provided in each of the second pixels PXL2, and the dummy lines DML may be disposed in the second conductive layer (second gate layer) together with the upper electrode UE of the storage capacitor Cst provided in each of the second pixels PXL2. In some embodiments, the dummy lines DML may be formed of the same or substantially the same material as the upper electrode UE of the storage capacitor Cst disposed in the same layer. For example, the dummy lines DML may be formed of a second gate metal (e.g., a predetermined second gate metal). However, the present disclosure is not limited thereto, and the material constituting the dummy lines DML may be variously and suitably changed.

That is, in an embodiment of the present disclosure, for example, the dummy lines DML connected to the second control lines S2$i$−1, S2$i$, S2$i$+1, and E2$i$ of the second display region PXA2 may be disposed in a layer different from that in which the second control lines S2$i$−1, S2$i$, S2$i$+1, and E2$i$ are disposed so as to compensate for a difference between load values of the display regions PXA. For example, the second control lines S2$i$−1, S2$i$, S2$i$+1, and E2$i$ are separated from an active pattern ACT of a set or predetermined transistor such that one region of each of the second control lines S2$i$−1, S2$i$, S2$i$+1, and E2$i$ overlapping with the active pattern ACT of the transistor with only the first insulating layer GI having a relatively thin thickness, which is interposed therebetween. That is, the second control lines S2$i$−1, S2$i$, S2$i$+1, and E2$i$ and the active pattern ACT, which overlap with each other in the second display region PXA2, are spaced apart from each other by a distance corresponding to the thickness of the first insulating layer GI along the thickness direction of the first insulating layer GI (e.g., when the substrate SUB and the first insulating layer GI are disposed on an XY plane, a Z direction perpendicular to the XY plane).

The dummy lines DML are separated from an eighth active pattern ACT8 constituting the first power supply line ELVDD with a plurality of insulating layers, that is, the first and second insulating layers GI and IL1 interposed therebetween. That is, the dummy lines DML and the eighth active pattern ACT8, which overlap with each other in the dummy region DMP, are spaced apart from each other by a distance corresponding to (e.g., substantially equal to or greater than) the sum of the thicknesses of the first and second insulating layers GI and IL1 among the thickness direction of the first and second insulating layers GI and IL1 (e.g., when the substrate SUB and the first and second insulating layers GI and IL1 are disposed on an XY plane, a Z direction perpendicular to the XY plane).

According to the embodiment of the present disclosure, set or predetermined transistors of which gate electrodes are connected to the second control lines S2$i$−1, S2$i$, S2$i$+1, and E2$i$ can be smoothly driven in response to a control signal applied from the second control lines S2$i$−1, S2$i$, S2$i$+1, and E2$i$. Further, the distance (gap) between the dummy lines DML and the eighth active pattern ACT8 are sufficiently secured in the dummy region DMP, so that it is possible to prevent or substantially reduce the incidence of a short circuit between the dummy lines DML and the eighth active pattern ACT8.

As described above, in an embodiment of the present disclosure, the second control lines S2$i$−1, S2$i$, S2$i$+1, and E2$i$ and the dummy lines DML, which are connected to each other, are disposed in different layers. Therefore, the display device according to the embodiment of the present disclosure further includes conductive bridges BRi1 to BRi4 (hereinafter, referred to as "BR") for electrically connecting the second control lines S2$i$−1, S2$i$, S2$i$+1, and E2$i$ to the dummy lines DML. For example, each of the dummy lines DML is connected to a set or predetermined second control line through one or more conductive bridges BR. That is, the bridges BRi1 to BRi4 for electrically connecting the second control lines S2$i$−1, S2$i$, S2$i$+1, and E2$i$ and the dummy line DMLi1, DMLi2, DMLi3, or DMLi4, which correspond to each other, are provided between the second control lines S2$i$−1, S2$i$, S2$i$+1, and E2$i$ and the dummy lines DML.

In some embodiments, the bridge BR, as shown in FIG. 9, may be disposed in the third layer on the third insulating layer IL2, for example, the source-drain layer. In an embodiment of the present disclosure, the bridge BR may be formed of the same or substantially the same material as the data lines Dk and Dk+1 and/or the power lines PLk and PLk+1, which are disposed in the same layer. For example, the bridge BR may be formed of a source-drain metal (e.g., a predetermined source-drain metal). However, the present disclosure is not limited thereto, and the material constituting the bridge BR may be variously and suitably changed.

In some embodiments, one end of the bridge BR may be connected to a set or predetermined second control line, for example, the (i+1)th second scan line S2$i$+1 through a contact hole (e.g., a contact opening) CNT1 passing through the second insulating layer IL1 and the third insulating layer IL2. In addition, the other end of the bridge BR may be connected to a set or predetermined dummy line, for example, the fourth dummy line DMLi4 through a contact hole CNT2 passing through the third insulating layer IL2.

In some embodiments, the bridge BR may be disposed adjacent to the second display region PXA2. For example, the bridge BR may be disposed in the second peripheral region PPA2 at one side of the second display region PXA2. However, the position of the bridge BR may be variously and suitably changed.

In some embodiments, the first power supply line ELVDD overlaps with the dummy lines DML in at least the dummy region DMP. In an embodiment of the present disclosure, the first power supply line ELVDD may be formed in a multi-layered structure in at least the dummy region DMP. For example, as shown in FIG. 9, the first power supply line ELVDD may include a main bus line PLB and an eighth active pattern ACT8.

In some embodiments, the eighth active pattern ACT8 may be provided in the same layer as the active patterns ACT1 to ACT7 of the transistors T1 to T7 provided in the second pixels PXL2_$k$ and PXL2_$k$+1. For example, the eighth active pattern ACT8 may be located in the active pattern layer provided between the substrate SUB and the first insulating layer GI.

The eighth active pattern ACT8 may be formed of a semiconductor layer undoped or doped with impurities. In some embodiments, the eighth active patter ACT8 may have a bar shape extending in the second direction DR2 and be disposed in plural numbers in the first direction DR1. However, the present disclosure is not limited thereto. When viewed from the top or plan view, the eighth active pattern ACT8 may partially overlap with the dummy lines DML, and the eighth active pattern ACT8 and the dummy lines DML are separated by the first insulating layer GI and the second insulating layer IL1 to maintain the state in which the eighth active pattern ACT8 and the dummy lines DML are insulated from each other.

In some embodiments, the main bus line PLB may extend from the power lines PLk and PLk+1 connected to the second pixels PXL2_$k$ and PXL2_$k$+1 disposed adjacent to the dummy region DMP to be integrally formed with the power lines PLk and PLk+1. The main bus line PLB may be provided in the same layer as the data lines Dk and Dk+1 and the power lines PLk and PLk+1. For example, the main bus line PLB may be disposed in the third conductive layer on the third insulating layer IL2 provided on the second conductive layer to be spaced apart from the dummy lines DML. The main bus line PLB may overlap with the eighth active pattern ACT8 and the dummy lines DML with the first insulating layer GI, the second insulating layer IL1, and/or the third insulating layer IL2, interposed therebetween. The main bus line PLB may cover the entirety or a portion of the second peripheral region PPA2.

In some embodiments, a fixed voltage supplied to the power lines PLk and PLk+1 may be applied to the main bus line PLB. For example, the fixed voltage may be a first power source applied to the first power supply line ELVDD.

In some embodiments, the main bus line PLB and the eighth active pattern ACT8 may be electrically connected to each other through a contact hole CNT3 passing through the first insulating layer GI, the second insulating layer IL1, and the third insulating layer IL2. In some embodiments, the contact hole CNT3 may be disposed in a region in which the main bus line PLB and the eighth active pattern ACT8 overlap with each other. For example, in the contact hole CNT3 may be provided in the region in which the dummy lines DML are not provided and the main bus line PLB and the eighth active pattern ACT8 overlap with each other. In some embodiments, at least one contact hole CNT3 may be provided, however, the number of contact holes CNT3 is not particularly limited. For example, a plurality of contact holes CNT3 may be uniformly distributed in the dummy region DMP.

In some embodiments, contact holes CNT3 having a number equal to or smaller than that of the contact holes CH1 to CH10 provided in each of predetermined second pixels PXL2_$k$ and PXL2_$k$+1 may be provided in the dummy region DMP. Here, the second pixels PXL2_$k$ and PXL2_$k$+1 may be pixels disposed closest to the dummy region DMP among the second direction DR2 in the second pixel region PXA2.

If a plurality of contact holes CNT3 are disposed in the dummy region DMP, a density of components (e.g., lines, active patterns, contact holes, and the like) disposed in the second pixels PXL2_$k$ and PXL2_$k$+1 disposed closest to the dummy region DMP can become similar to that of components disposed in the dummy region DMP. Accordingly, the second pixels PXL2_$k$ and PXL2_$k$+1 can be easily formed as desired in a process using a mask.

The fourth insulating layer PSV may be provided on the substrate SUB on which the main bus line PLB is formed. In addition, the pixel defining layer PDL may be provided on the substrate SUB on which the fourth insulating layer PSV is formed. In some embodiments, the fourth insulating layer PSV and the pixel defining layer PDL may be organic insulating layers made of an organic material. The encapsulation layer SML covering the pixel defining layer PDL may be provided on the pixel defining layer PDL.

In the above-described embodiment of the present disclosure, the dummy lines DML and the first power supply line ELVDD overlap with each other in at least the dummy region DMP. Hence, a parasitic capacitance is formed in the dummy region DMP. Therefore, load values of the second control lines S2$i$−1, S2$i$, S2$i$+1, and E2$i$ connected to the dummy lines DML increase. Accordingly, it is possible to compensate for a difference between load values of the first control lines S1$i$−1, S1$i$, S1$i$+1, and E1$i$ provided in the first display region PXA1 and the second control lines S2$i$−1, S2$i$, S2$i$+1, and E2$i$ provided in the second display region PXA2.

In some embodiments, the size (length, width, area, thickness, etc.) of the dummy lines DML and/or the material constituting the dummy lines DML may be set such that load values of the first control lines S1$i$−1, S1$i$, S1$i$+1, and E1$i$ and the second control lines S2$i$−1, S2$i$, S2$i$+1, and E2$i$ become similar or equal to each other. That is, in an embodiment of the present disclosure, parasitic capacitances formed in the dummy lines DML may be differently set depending on a load value of the second control lines S2$i$−1, S2$i$, S2$i$+1, and E2$i$ to be compensated.

In the above-described embodiment of the present disclosure, the second control lines S2$i$−1, S2$i$, S2$i$+1, and E2$i$ are located in the first conductive layer (first gate layer) to be adjacent to the active pattern layer in which the active patterns ACT1 to ACT7 of the transistors T1 to T7. That is, as described above, one region of each of the second control lines S2$i$−1, S2$i$, S2$i$+1, and E2$i$ overlaps with the active pattern ACT of a set or predetermined transistor with the first insulating layer GI having a relatively thin thickness, which is interposed therebetween, so that the set or predetermined transistors of which gate electrodes are connected to the second control lines S2$i$−1, S2$i$, S2$i$+1, and E2$i$ can be smoothly driven.

Unlike the second control lines S2$i$−1, S2$i$, S2$i$+1, and E2$i$, the dummy lines DMLi1, DMLi2, DMLi3, and DMLi4 are located in the second conductive layer (second gate layer) on the second insulating layer IL1 in at least the dummy region DMP. Thus, the dummy lines DMLi1, DMLi2, DMLi3, and DMLi4 are spaced apart from the eighth active patterns ACT8 with at least first and second insulating layers GI and IL1 interposed therebetween. Accordingly, although ESD or the like is introduced into the dummy region DMP, the probability that a short circuit will occur between the dummy lines DMLi1, DMLi2, DMLi3, and DMLi4 and the eighth active patterns ACT8 is lowered. That is, according to the embodiment of the present disclosure, the dummy lines DMLi1, DMLi2, DMLi3, and DMLi4 are disposed in the second conductive layer in the dummy region DMP having a relatively high probability that ESD will be introduced into the dummy region DMP as the dummy region DMP is located in an edge region of the substrate SUB, so that it is possible to secure a sufficient distance between the eighth active patterns ACT8 and the dummy lines DMLi1, DMLi2, DMLi3, and DMLi4.

Although the dummy lines DMLi1, DMLi2, DMLi3, and DMLi4 are disposed in the second conductive layer, the dummy lines DMLi1, DMLi2, DMLi3, and DMLi4 are spaced apart from the main bus line PLB by the third insulating layer IL2 that may be formed relatively thicker than the first and second insulating layers GI and IL1. The third insulating layer IL2 has a thickness that is relatively less limited as compared to the first insulating layer GI, of which thickness is limited so as to ensure the driving stability of the transistors T1 to T7, or the second insulating layer IL1, of which thickness is limited so as to secure the capacitance of the storage capacitor Cst. For example, the third insulating layer IL2 may be formed to have a thickness greater than the sum of the thickness of the first insulating layer GI and the thickness of the second insulating layer IL1.

For example, the first insulating layer GI and the second insulating layer IL1 may have a similar thickness range, for example, a range of 1000 Å to 1500 Å, and the third insulating layer IL2 may be set to have a thickness two times or more of the thickness of the first insulating layer GI or the second insulating layer IL1. For example, the third insulating layer IL2 may have a thickness of about 500 Å. In some embodiments, each of the first insulating layer GI interposed between the active patterns ACT of the display regions PXA and the gate electrodes GE and the second insulating layer IL1 interposed between the upper electrode UE and the lower electrode LE of the storage capacitor Cst may have a thickness corresponding to about 15% to about 25% of the total thickness obtained by adding all of the thicknesses of the first to third insulating layers GI, IL1, and IL2. Because both of the first and second insulating layers GI and IL1 are interposed between the eighth active patterns ACT8 and the dummy lines DML of the dummy region, the thickness of an insulating layer between the eighth active patterns ACT8 and the dummy lines DML may have a thickness corresponding to about 30% or more (e.g., about 30% to about 50%) of the total thickness obtained by adding all of the thicknesses of the first to third insulating layers GI, IL1, and IL2. In addition, because the third insulating layer IL2 has a thickness equal to or greater than the total thickness of the first and second insulating layers GI and IL1, a distance between the dummy lines DML and the main bus line PLB of the dummy region DMP may be equal to or greater than that between the eighth active patterns ACT8 and the dummy lines DML. That is, the third insulating layer IL2 interposed between the dummy lines DML and the main bus line PLB may have a thickness corresponding to 50% or more of the total thickness obtained by adding all of the thicknesses of the first to third insulating layers GI, IL1, and IL2.

Thus, although the dummy lines DMLi1, DMLi2, DMLi3, and DMLi4 are disposed in the second conductive layer, it is possible to secure a sufficient distance between the dummy lines DMLi1, DMLi2, DMLi3, and DMLi4 and the main bus line PLB. That is, according to the embodiment of the present disclosure, it is possible to prevent or substantially reduce the incidence of a short circuit between the dummy lines DML and the first power supply line ELVDD.

As described above, according to the embodiment of the present disclosure, it is possible to provide a display device having a structure strong against ESD while displaying images with uniform image quality by compensating for a difference between load values of the first control lines S1$i$−1, S1$i$, S1$i$+1, and E1$i$ and the second control lines S2$i$−1, S2$i$, S2$i$+1, and E2$i$.

For convenience, the dummy region DMP that is located in the second peripheral region PPA2 and includes the dummy lines DMLi1, DMLi2, DMLi3, and DMLi4 connected to the second pixels PXL2 has been illustrated in FIGS. 8 to 10, and its configuration has been described. However, in an embodiment of the present disclosure, a dummy region DMP including dummy lines connected to the third control lines (S31, S32, E31, and E32 of FIG. 3) of the third pixels PXL3 may also be provided in the third peripheral region PPA3. That is, in some embodiments, the dummy region DMP located in the third peripheral region PPA3 may be configured to be substantially identical to the dummy region DMP located in the second peripheral region PPA2. Thus, in the display device according to the embodiment of the present disclosure, it is possible to prevent or substantially reduce the incidence of a short circuit in the dummy region DMP located in the third peripheral region PPA3.

Figure 11:
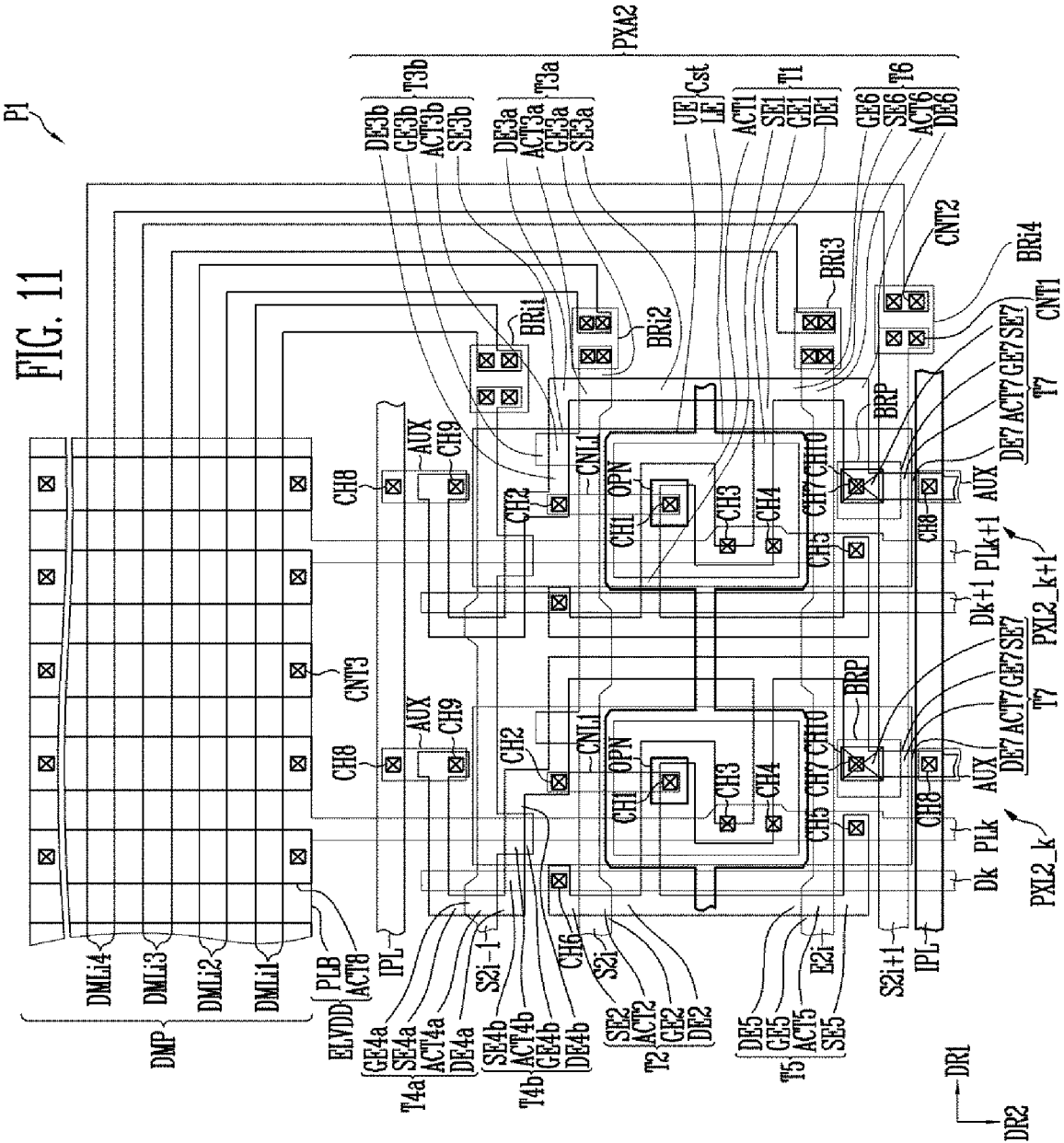
FIG. 11 illustrates the detailed structure of an embodiment of the second pixels and the dummy region corresponding to the region P1 shown in FIG. 1.

FIG. 11 illustrates an embodiment of the detailed structure of the second pixels and the dummy region corresponding to the region P1 shown in FIG. 1. FIG. 11 illustrates a modification in which the structure of the dummy region shown in FIG. 8 is partially modified. In FIG. 11, components similar to or identical to those shown in FIGS. 8 to 10 are designated by like reference numerals, and their detailed descriptions may not be repeated.

Referring to FIG. 11, the number and/or distribution of contact holes CNT3 through which the eighth active patterns ACT8 and the main bus line PLB are electrically connected in the dummy region DMP may be changed. For example, the contact hole CNT3 is not provided in a region between the dummy lines DMLi1, DMLi2, DMLi3, and DMLi4, and may be provided at an edge (e.g., only an edge) of the dummy region DMP. For example, the contact holes CNT3 may be provided at an upper edge of the dummy region DMP (e.g., an upper edge of the substrate SUB) and a lower edge of the dummy region DMP (e.g., between the second display region PXA2 and the dummy region DMP), respectively. In another embodiment, the contact hole CNT3 may be provided at the upper edge (e.g., only the upper edge) of the dummy region DMP, or may be provided at the lower edge (e.g., only the lower edge) of the dummy region DMP. However, the position of the contact hole CNT3 is not limited thereto, and may be variously modified, as suitable, and implemented.

In some embodiments, the first power supply line ELVDD may include a plurality of eighth active patterns ACT8 extending in a direction crossing the dummy lines DMLi1, DMLi2, DMLi3, and DMLi4 between the substrate SUB and the first insulating layer GI, a main bus line PLB located in the third conductive layer on the third insulating layer IL2 to overlap with the eighth active patterns ACT8, and a plurality of contact holes CNT3 provided at an edge of the dummy region DMP, the plurality of contact holes CNT3 electrically connecting the eighth active patterns ACT8 and the main bus line PLB therethrough.

That is, in the display device according to the embodiment of the present disclosure, the contact structure between the eighth active patterns ACT8 and the main bus line PLB, which constitute the first power supply line ELVDD, is not particularly limited. For example, the eighth active patterns ACT8 and the main bus line PLB may be connected in various suitable forms by considering the area of an available peripheral region PPA, a process environment, and/or the like.

Figure 12:
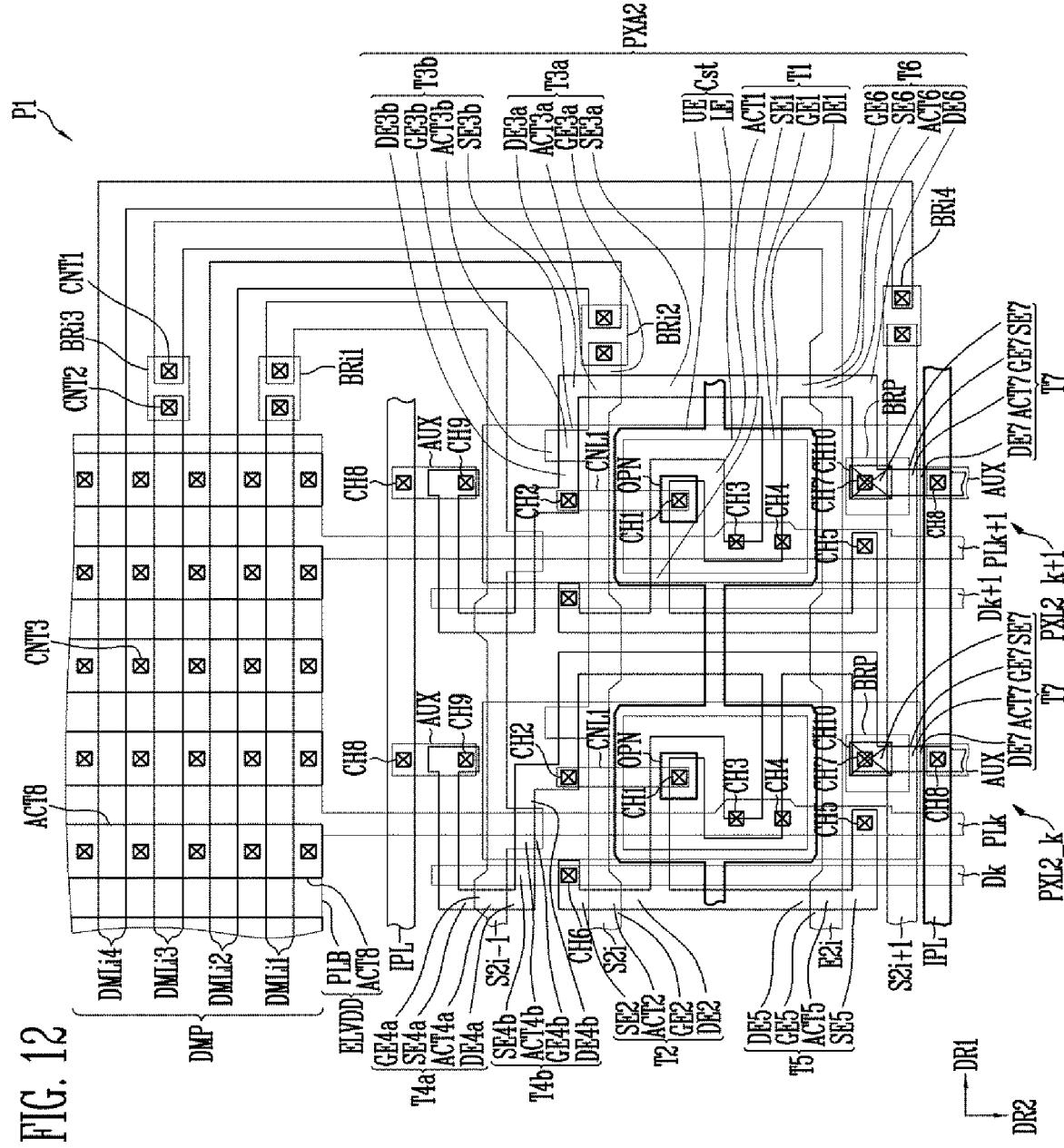
FIG. 12 illustrates an embodiment of the detailed structure of the second pixels and the dummy region corresponding to the region P1 shown in FIG. 1.

FIG. 12 illustrates an embodiment of the detailed structure of the second pixels and the dummy region corresponding to the region P1 shown in FIG. 1. FIG. 12 illustrates a modification in which the connection structure between the dummy lines and the second control lines, shown in FIG. 8, is partially modified. In FIG. 12, components similar to or identical to those shown in FIGS. 8 to 10 are designated by like reference numerals, and their detailed descriptions may not be repeated.

Referring to FIG. 12, in some embodiments, the position of the conductive bridge BR may be variously and suitably changed. That is, in the display device according to the embodiment of the present disclosure, the connection position between the second control lines S2$i$−1, S2$i$, S2$i$+1, and E2$i$ and the dummy lines DMLi1, DMLi2, DMLi3, and DMLi4 may be changed.

For example, at least some bridges BR may be disposed at one side of the second display region PXA2 to be adjacent to the second display region PXA2, and the other bridges BR may be disposed at one side of the dummy region DMP to be adjacent to the dummy region DMP. For example, odd-numbered dummy lines DMLi1 and DMLi3 and second control lines S2$i$−1 and E2$i$ corresponding thereto may be connected to bridges BRi1 and BRi3 disposed at one side of the dummy region DMP. In addition, even-numbered dummy lines DMLi2 and DMLi4 and second control lines S2$i$ and S2$i$+1 corresponding thereto may be connected by bridges BRi2 and BRi4 disposed at one side of the second display region PXA2.

That is, in some embodiments, a bridge (e.g., BRi1 or BRi3) connecting a pair of a second control line (e.g., S2$i$−1 or E2$i$) and a dummy line (e.g., DMLi1 or DMLi3), which are connected to each other, among the second control lines S2$i$−1, S2$i$, S2$i$+1, and E2$i$ and the dummy lines DMLi1, DMLi2, DMLi3, and DMLi4 may be disposed at one side of the dummy region DMP. In addition, a bridge (e.g., BRi2 or BRi4) connecting another pair of a second control line (e.g., S2$i$ or S2$i$+1) and a dummy line (e.g., DMLi2 or DMLi4), which are adjacent to the pair of the second control line (e.g., S2$i$−1 or E2$i$) and the dummy line (e.g., DMLi1 or DMLi3), among the second control lines S2$i$−1, S2$i$, S2$i$+1, and E2$i$ and the dummy lines DMLi1, DMLi2, DMLi3, and DMLi4 may be disposed at one side of the second display region PXA2.

In an embodiment of the present disclosure, second control lines S2$i$−1 and E2$i$ connected to dummy lines (e.g., predetermined dummy lines) DMLi1 and DMLi3 by bridges BRi1 and BRi3 disposed at one side of the dummy region may integrally extend from the second display region PXA2 to the second peripheral region PPA in which the bridges BRi1 and BRi3 are disposed. In an embodiment of the present disclosure, dummy lines DMLi2 and DMLi4 connected to second control lines (e.g., predetermined second control lines) S2$i$ and S2$i$+1 by bridges BRi2 and BRi4 disposed at one side of the second display region PXA2 may integrally extend from the dummy region DMP to the second peripheral region PPA2 at one side of the second display region PXA2.

The number of contact holes CNT1 and CNT2 formed in each of the bridges BRi1, BRi2, BRi3, and BRi4 is not particularly limited. For example, the number of contact holes CNT1 and CNT2 formed in the bridges BRi1, BRi2, BRi3, and BRi4 may be adjusted by considering a securable design space, a contact resistance, etc.

In the above-described embodiment of the present disclosure, extending parts of set or predetermined second control lines S2$i$−1 and E2$i$ located in the first conductive layer and extending parts of set or predetermined dummy lines DMLi2 and DMLi4 located in the second conductive layer are alternately disposed in a routing region located between the second display region PXA2 and the dummy region DMP. Because the first conductive layer and the second conductive layer are spaced apart from each other with the second insulating layer IL1 interposed therebetween, the extending parts of the second control lines (e.g., predetermined second control lines) S2$i$−1 and E2$i$ and the extending parts of the dummy lines (e.g., predetermined dummy lines) DMLi2 and DMLi4 may be disposed in the routing region such that the distance between the extending parts is narrowed. As described above, according to the embodiment of the present disclosure, the second control lines S2$i$−1, S2$i$, S2$i$+1, and E2$i$ and the dummy lines DMLi1, DMLi2, DMLi3, and DMLi4 can be easily connected even when the number of the second control lines S2$i$−1, S2$i$, S2$i$+1, and E2$i$ and the dummy lines DMLi1, DMLi2, DMLi3, and DMLi4 increases or when the routing region is not sufficiently secured as a peripheral region, for example, the second peripheral region PPA2 is narrow.

According to the present disclosure, it is possible to provide a display device having a structure strong against ESD while displaying images having uniform image quality by compensating for a difference between load values of lines.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

Example embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various suitable changes in form and details may be made without departing from the spirit and scope of the present disclosure as set forth in the following claims, and equivalents thereof.

What is claimed is:

1. A display device comprising:
    a substrate comprising a first display region having a first width in a first direction, a second display region having a second width smaller than the first width in the first direction, a peripheral region at a periphery of the first and second display regions, and a dummy region in the peripheral region;
    a first pixel in the first display region;
    a second pixel in the second display region;
    a first control line connected to the first pixel, the first control line being in the first display region;
    a second control line connected to the second pixel, a portion of the second control line being in the second display region; and
    a dummy line connected to the second control line, a portion of the dummy line being in the dummy region,
    wherein the second pixel comprises a storage capacitor,
    wherein the dummy line forms a parasitic capacitance in the dummy region, and
    wherein a first electrode of the storage capacitor and a first electrode of the parasitic capacitance are at different conductive layers.

2. The display device of claim 1,
    wherein a second electrode of the storage capacitor and the first electrode of the parasitic capacitance are at a same conductive layer.

3. The display device of claim 2,
    wherein a first distance between the first electrode and the second electrode of the storage capacitor is shorter than a second distance between the first electrode and a second electrode of the parasitic capacitance.

4. The display device of claim 3,
    wherein the second electrode of the parasitic capacitance is at an active pattern layer on the substrate.

5. The display device of claim 4,
    wherein the first electrode of the storage capacitor is at a first conductive layer on a first insulating layer on the active pattern layer.

6. The display device of claim 5,
    wherein the second electrode of the storage capacitor and the first electrode of the parasitic capacitance are at a second conductive layer on a second insulating layer on the first conductive layer.

7. The display device of claim 1,
    wherein the second control line is at a first conductive layer on a first insulating layer, the first insulating layer is on the substrate, the dummy line is at a second conductive layer on a second insulating layer, and the second insulating layer is on the first conductive layer.

8. The display device of claim 7, further comprising a conductive bridge connecting the second control line and the dummy line.

9. The display device of claim 8, wherein the conductive bridge is at a third conductive layer on a third insulating layer, the third insulating layer being on the second conductive layer.

10. The display device of claim 9, further comprising:
    an active pattern between the substrate and the first insulating layer, the active pattern being in the dummy region,
    wherein the portion of the dummy line overlaps with the active pattern in the dummy region.

11. The display device of claim 7, further comprising a power supply line in the peripheral region, the power supply line at least partially overlapping with the dummy line.

12. The display device of claim 11, wherein the power supply line comprises:
    an active pattern between the substrate and the first insulating layer; and
    a main bus line at a third conductive layer on a third insulating layer, the third insulating layer being on the second conductive layer, the main bus line being connected to the active pattern through a contact opening.

13. The display device of claim 12, wherein a thickness of the third insulating layer is greater than a thickness of the first insulating layer and a thickness of the second insulating layer.

14. The display device of claim 13, wherein the thickness of the third insulating layer is equal to or greater than a sum of the thickness of the first insulating layer and the thickness of the second insulating layer.

15. The display device of claim 11, wherein the power supply line comprises:
    a plurality of active patterns between the substrate and the first insulating layer, the plurality of active patterns extending in a direction crossing the dummy line;
    a main bus line at a third conductive layer on a third insulating layer, the third insulating layer being on the second conductive layer, the main bus line overlapping with the active patterns; and
    a plurality of contact openings at an edge of the dummy region, the plurality of contact openings facilitating electrical connections between the active patterns and the main bus line.

16. The display device of claim 8, wherein the conductive bridge is at one side of the second display region.

17. The display device of claim 8, wherein the conductive bridge is at one side of the dummy region.

18. The display device of claim 1, wherein the second pixel is connected to a plurality of other second control lines to which different signals are applied, and a plurality of other dummy lines connected to different second control lines from among the plurality of other second control lines are in the dummy region.

19. The display device of claim 18, wherein one of the other second control lines and one of the other dummy lines are connected to each other by one of first conductive bridges at one side of the second display region, and wherein another one of the other second control lines and another one of the other dummy lines, are connected to each other by one of second conductive bridges at one side of the dummy region.

20. The display device of claim 19, wherein ones of the other dummy lines connected to the first conductive bridges at the one side of the second display region and other ones of the other dummy lines connected to the second conductive bridges at the one side of the dummy region are alternately arranged in the dummy region.

\* \* \* \* \*